United States Patent [19]

Adolphson et al.

[11] Patent Number: 5,075,722
[45] Date of Patent: Dec. 24, 1991

[54] OFF-PRESS LAMINATING METHOD

[75] Inventors: Douglas G. Adolphson, West Grove, Pa.; James S. Millar, Centerville, Del.

[73] Assignee: E. I. Du Pont de Nemours and Company, Wilmington, Del.

[21] Appl. No.: 612,976

[22] Filed: Nov. 15, 1990

[51] Int. Cl.⁵ .................................................. G03B 27/32
[52] U.S. Cl. ........................................ 355/77; 355/85; 355/88
[58] Field of Search ............................... 355/77, 85, 88

[56] References Cited

U.S. PATENT DOCUMENTS

| | | | |
|---|---|---|---|
| 3,227,060 | 1/1966 | Baumbach | 355/88 |
| 3,671,236 | 6/1972 | Van Beusekom | 96/15 |
| 4,053,313 | 10/1977 | Fan | 96/36 |
| 4,325,631 | 4/1982 | McCullion | 355/77 |
| 4,376,158 | 3/1983 | Spechler | 430/291 |
| 4,376,159 | 3/1983 | Spechler | 430/293 |
| 4,626,097 | 12/1986 | Uchida | 355/77 |
| 4,656,114 | 4/1987 | Cederberg et al. | 430/160 |
| 4,659,927 | 4/1987 | Tago et al. | 250/318 |
| 4,666,817 | 5/1987 | Sachi | 430/160 |

FOREIGN PATENT DOCUMENTS 2144867 3/1985 United Kingdom .

*Primary Examiner*—Monroe H. Hayes
*Attorney, Agent, or Firm*—John E. Griffiths

[57] ABSTRACT

The present invention relates to an off-press method for laminating an image sheet to an image receiving substrate and, more particularly, for laminating a plurality of image sheets to the receiving substrate and then laminating a portion of the receiving substrate to a display sheet.

15 Claims, 12 Drawing Sheets

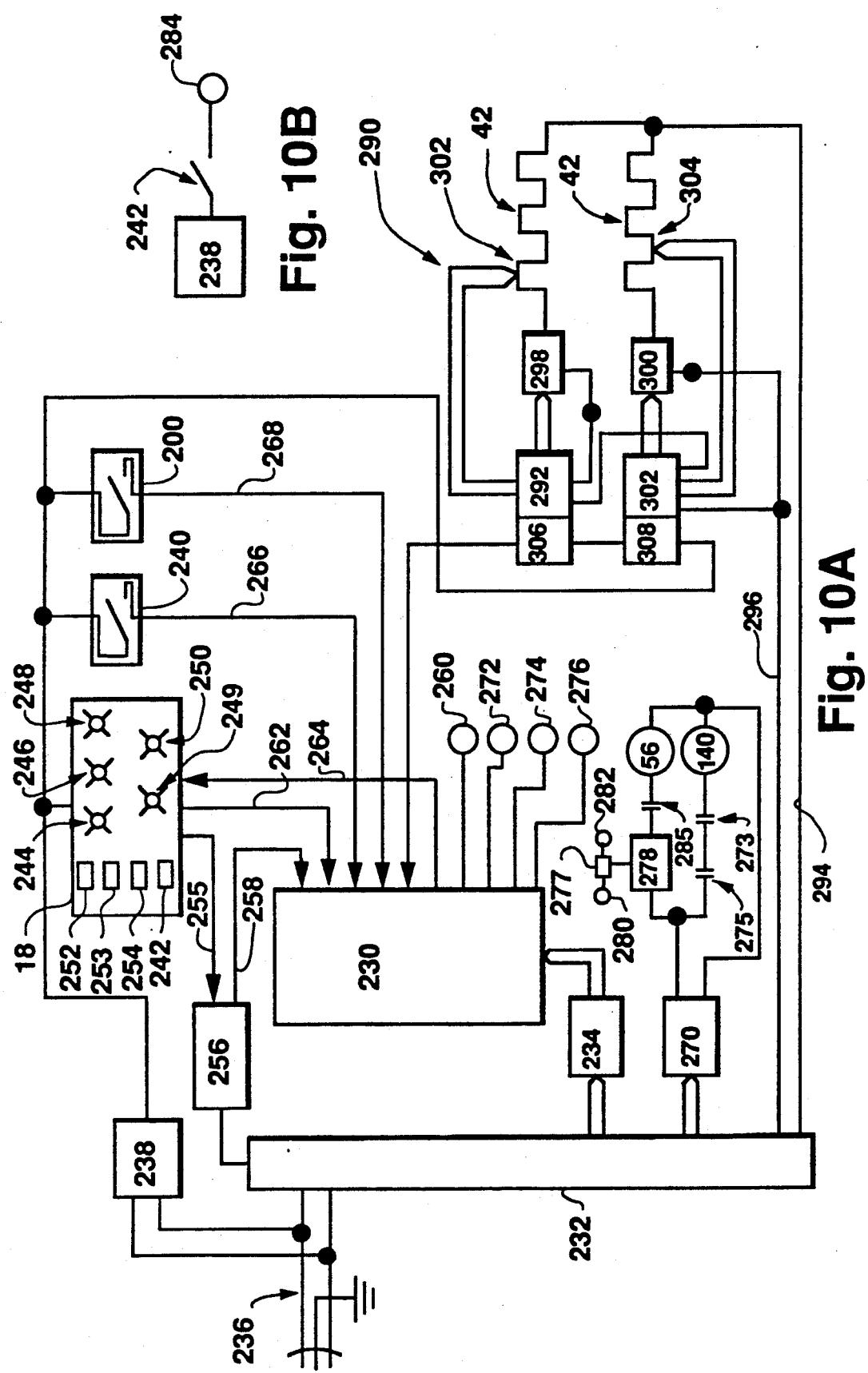

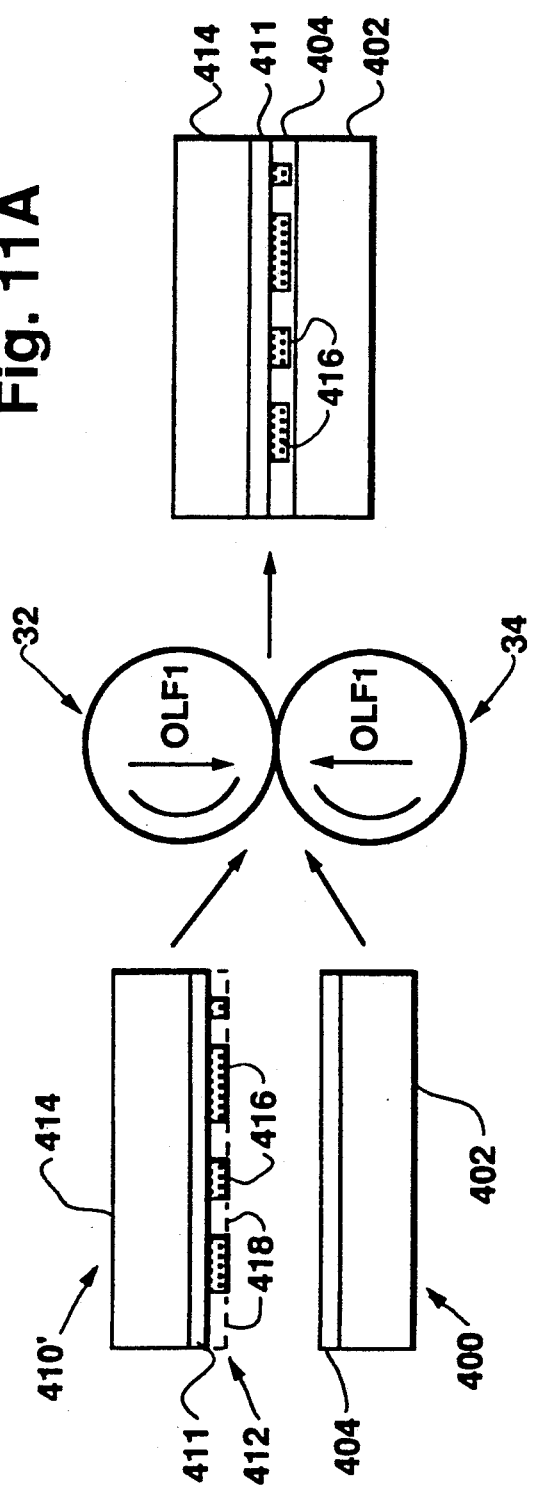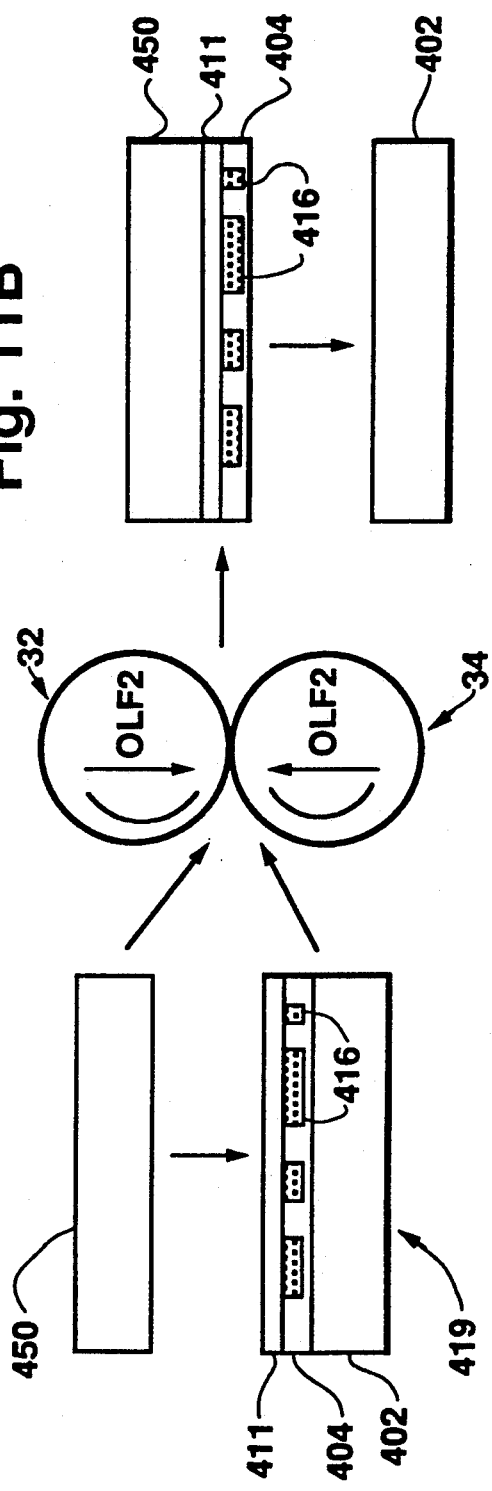

OFF-PRESS LAMINATING METHOD

BACKGROUND OF THE INVENTION

1. Field of the Invention

This invention relates to an off-press method for laminating an image sheet to an image receiving substrate and, more particularly, for laminating a plurality of image sheets to the receiving substrate and then laminating a portion of the receiving substrate to a display sheet.

2. Description of Related Art

Reproduction of color images through printing is an involved process requiring a breakdown of an original image into a number of fundamental single color images and the eventual recombination of the single color images through multiple printings into a full color reproduction of the original. Color image reproduction typically includes the following steps.

First, using filtering and other photographic techniques a number of color separation transparencies or color separations are produced, typically four, each bearing a halftone dot and/or a continuous tone (contone) image corresponding, for instance, to magenta, cyan, yellow and black portions of the original. Second, a printing plate is made for each color separation by exposing a sensitized plate through one of the transparencies and developing the plate. Third, the printing plates are mounted on a multistage printing press which prints inks on a substrate, typically paper, sequentially and in register, one on top of another, four halftone and/or contone images corresponding to each of the color separations to create a full color reproduction of the original.

In the case of halftone images, the various colors are reproduced by the superposition of a multiplicity of dots of varying diameters and colors corresponding to the four color separations. Any deviation in the size or position of the printed dots results in color shifts in the final printed image. As a result of this reproduction process, setting up the press and printing a four color image is economically feasible typically only when employed for printing large quantities of a given original.

It is desirable to be able to predict the final image appearance before it is printed, and preferably before making printing plates by reviewing images made directly from the color separation transparencies. The art of evaluating the color separation transparencies and deciding whether the various colors have indeed been properly separated is called proofing. Proofing is a process which uses the color separations to create a colored image called a proof to visualize what the final printed image will look like typically without actually making printing plates and running the printing press. Proofing through the creation of proofs shows the printer and customer what the job will look like after printing, so changes can be made, if necessary, to the color separations before the job goes to press where it can waste expensive press time, paper and ink if it is not right. Proofs are used for many purposes including for customer approval, for checking compatibility of a number of subjects to be printed on the same plate or job, for internal quality checking and control, and for relatively small numbers of final reproductions.

For many years the only way to make proofs was to print them on a press. This involved making plates, mounting them on the press, making the press ready to run, and running a few prints. Proofs of this type are very expensive because they involve labor intensive operations and the use of expensive materials (e.g., plates) and cost intensive equipment (e.g., the press). Special proof presses have been built to eliminate the high costs of using production presses, but manpower costs are still high and special proof presses do not always reproduce the printing and visual characteristics of the production press. Furthermore, press proofing by either of these techniques takes a long time to make proofs.

Because of the time and expense to make press proofs attempts have been made to develop and use less expensive and faster alternatives to press proofs. These are usually made by photochemical or photomechanical means and are referred to as off-press, pre-press or pre-plate proofs.

Photochemical or photomechanical proofing systems typically use photosensitive elements in making proofs. These systems generally make proofs by exposing photosensitive elements to actinic radiation through one of the image bearing color separation transparencies to produce a duplicate image that is either a positive or a negative of the transparency depending on the element used. The radiation may make soluble areas insoluble, insoluble areas soluble, tacky areas nontacky, or nontacky areas tacky depending on the element used. After imagewise exposure, the photosensitive element can be developed by washing out soluble areas. Then tacky areas of the element may have to be toned with a dry or liquid colorant. This process is repeated for all color separations. Then the processed elements are laminated together one at a time sometimes on a support or substrate. Protective layers may be peeled apart and removed from the elements before they are laminated to the support or other image elements. Finally, the four color images may be transferred from the support to a receptor, transfer or display sheet, such as a sheet of paper, to form the final proof.

Many photosensitive elements used for image reproduction have the disadvantage that they must be washed out by an organic solvent or aqueous base. For instance, U.S. Pat. No. 4,053,313 to Fan discloses a photosensitive element comprising a solvent-processable photosensitive layer, a tonable elastomeric layer and a support, that is processed (i.e., washed-out) by a mixture of water and organic solvent. The elements disclosed in U.S. Pat. Nos. 4,376,158 and 4,376,159 to Speckler require aqueous base for washout. Precolored diazo based photosensitive elements which are developed in a mixture of 1-propanol and water are disclosed, for example, in U.S. Pat. No. 3,671,236 to Van Beusekom, U.S. Pat. No. 4,656,114 to Cederburg and U.S. Pat. No. 4,666,817 to Sachi. Use of organic solvents or aqueous bases frequently is undesirable due to flammability, toxicity, corrosion and/or waste disposal considerations. The photosensitive elements disclosed in these Fan and Speckler Patents also require the developed (i.e., washed-out) elements to be toned either manually or in a toning apparatus.

Photosensitive elements are known and are being developed that do not have the above described disadvantages. Specifically, U.K. Patent publication GB 2144867 B discloses photosensitive elements having entirely aqueously developable precolored layers containing a colorant on a removeable support. The U.K. Patent further describes a photomechanical process for forming a multicolor image, suitable for use as an off-press proof utilizing the aqueously developable photosensitive elements. The process for preparing a multicolor image is accomplished by (1) imagewise exposure of a first one of the precolored photosensitive elements comprising an aqueously developable precolored photosensitive layer on a removeable support through a first one of the color separation transparencies forming image areas and non-image areas in its aqueously developable precolored layer, (2) processing the exposed element to develop the color image by washing away the non-image areas with water, (3) laminating the image bearing element to a substrate, and then (4) peeling the removeable support from the image bearing element. A second color image element is made by exposing a second precolored photosensitive element with a second one of the color separation transparencies, processing to develop the color image, laminating in register the second color image element to the first color image element on the substrate and peeling the removeable support from the second color image element. By repeating the exposing, processing, laminating in register, and peeling steps two more times, a four color image can be obtained. As long as the emulsion layer of the color separation contacts the photosensitive layer in the photosensitive element during the exposure step as is preferred, the process described in this U.K. Patent results in a wrong reading proof on the substrate. This means that the image on the substrate is a mirror image of that captured in the color separations.

Often it is desirable to view the multicolored image on a receptor or a transfer sheet, such as paper, which is the same as or similar to that which will be used in the final printing run. In this case, the multicolor image is transferred to the desired receptor by laminating and then peeling away the substrate. This results in a right reading proof assuming the emulsion layer of the color separation contacts the photosensitive layer in the photosensitive element during the exposure step. A right reading proof is the same as the original image, not a mirror image.

Many apparatuses have been developed for laminating photosensitive elements. Different laminating apparatuses are designed and used for laminating different photosensitive elements. However, aqueously developable precolored photosensitive elements are a relatively recent development. As such, few apparatuses exist for use in laminating aqueously developed precolored photosensitive elements or image sheets to supports or receiving substrates.

U.S. Pat. No. 4,659,927 to Tago et al. assigned to Fuji Photo Film Co., Ltd., discloses a laminator and a method utilizing the laminator for preparing a multicolor proof. The laminator comprises a pair of insertion rollers for feeding superposed sheets into the laminator, a pair of heated rollers for receiving the sheets from the insertion rollers and for heating and applying pressure to the sheets, and a pair of cooling rollers for cooling the sheets fed from the heated rollers. The manner in which the rollers are supported and transported is not disclosed.

A laminator is commercially available from Fuji Photo Film Co., Ltd., for laminating aqueously developed precolored photosensitive elements or image sheets to supports or receiving substrates. The laminator includes the parts described in the aforedescribed Fuji Patent. The laminator operates at one nip distance and pressure setting limiting its use with a variety of photosensitive elements, supports or receiving substrates and final transfer or display sheets. Only one of the heated rollers is driven by a motor. The other heated roller is rotated by frictional contact through the sheets sandwiched between the rollers. This causes slippage of the layers in the sheets during the laminating causing misregistration of colors in reproduced images and transfer irregularities.

It is desirable to have an off-press apparatus for laminating aqueously developed precolored photosensitive elements or image sheets to supports or receiving substrates.

It is an object of this invention to provide an apparatus for laminating an aqueously developed precolored photosensitive element which operates at more than one operating pressure or linear force setting enabling its use with a variety of photosensitive elements, supports or receiving substrates and final transfer or display sheets.

It is another object of this invention to provide an apparatus for laminating multiple image sheets to a receiving substrate and optionally then for laminating a portion of the receiving substrate to a display sheet which assures substantial registration of colors in a final proof.

These and other objects of the invention have been achieved in the present invention as will be clear from the following.

SUMMARY OF THE INVENTION

The present invention relates to an off-press method for laminating a color image sheet to an image receiving substrate and then transferring the color image from the receiving substrate to a transfer sheet to form a proof, comprising:

exposing a first precolored photosensitive element comprising a first aqueously developable precolored photosensitive layer on a first removeable support through a first color separation transparency forming first image areas and first non-image areas in the first aqueously developable precolored layer;

processing the exposed first element to develop a first color image by washing away the first non-image areas with water;

laminating the first image bearing element to a substrate by transporting the first image bearing element on the substrate through a pair of heated rollers which are parallel or substantially parallel and set to apply a first operating pressure or linear force on the first image bearing element and the substrate;

peeling the removeable support from the first image bearing element; and laminating a transfer sheet to the first image bearing element through the pair of heated rollers set to apply a second operating pressure or linear force on the first image bearing element and the transfer sheet.

The present invention is further directed to an off-press method for laminating color image sheets to an image receiving substrate and then transferring multicolor images from the receiving substrate to a transfer sheet to form a proof, comprising:

exposing a first precolored photosensitive element comprising a first aqueously developable precolored photosensitive layer on a first removeable support through a first color separation transparency forming first image areas and first non-image areas in the first aqueously developable precolored layer;

processing the exposed first element to develop a first color image by washing away the first non-image areas with water;

laminating the first image bearing element to a substrate by transporting the first image bearing element on the substrate through a pair of heated rollers which are parallel or substantially parallel and set to apply a first operating pressure or linear force on the first image bearing element and the substrate;

peeling the removeable support from the first image bearing element;

repeating the exposing step, the processing step, the laminating step and the peeling step with (1) a second precolored photosensitive element comprising a second aqueously developable precolored photosensitive layer on a second removeable support instead of the first element, (2) a second color separation transparency instead of the first transparency, and (3) in the laminating step, laminating the second image bearing element substantially in register on the first image bearing element, rather than on the substrate;

repeating the first exposing step, the first processing step, the first laminating step and the first peeling step with (1) a third precolored photosensitive element comprising a third aqueously developable precolored photosensitive layer on a third removeable support instead of the first element, (2) a third color separation transparency instead of the first transparency, and (3) in the laminating step, laminating the third image bearing element on the second image bearing element and substantially in register with the first image bearing element;

repeating the first exposing step, the first processing step, the first laminating step and the first peeling step with (1) a fourth precolored photosensitive element comprising a fourth aqueously developable precolored photosensitive layer on a fourth removeable support instead of the first element, (2) a fourth color separation transparency instead of the first transparency, and (3) in the laminating step, laminating the fourth image bearing element on the third image bearing element and substantially in register with the first image bearing element; and laminating a transfer sheet to the fourth image bearing element through the pair of heated rollers set to apply a second operating pressure or linear force on the substrate and the transfer sheet sandwiching the first, second, third and fourth image bearing elements.

BRIEF DESCRIPTION OF THE DRAWINGS

The invention can be more fully understood from the following detailed description thereof in connection with accompanying drawings described as follows.

FIG. 10A is a schematic illustration of an electrical control system for the present invention.

FIG. 10B is a schematic illustration of a "reverse select" switch in series with a coil portion of a "reverse select" relay.

FIG. 11A is a schematic illustration of laminating by applying pressure and heat through a nip set at a first operating pressure or linear force between a first roller assembly and a second roller assembly to sandwich an image sheet having one colored image together with a receiving substrate having no colored images.

FIG. 11B is a schematic illustration of laminating by applying pressure and heat through a nip set at a second operating pressure or linear force between a first roller assembly and a second roller assembly to sandwich the receiving substrate having one colored image together with a transfer sheet.

DESCRIPTION OF THE PREFERRED EMBODIMENT(S)

Figure 1:
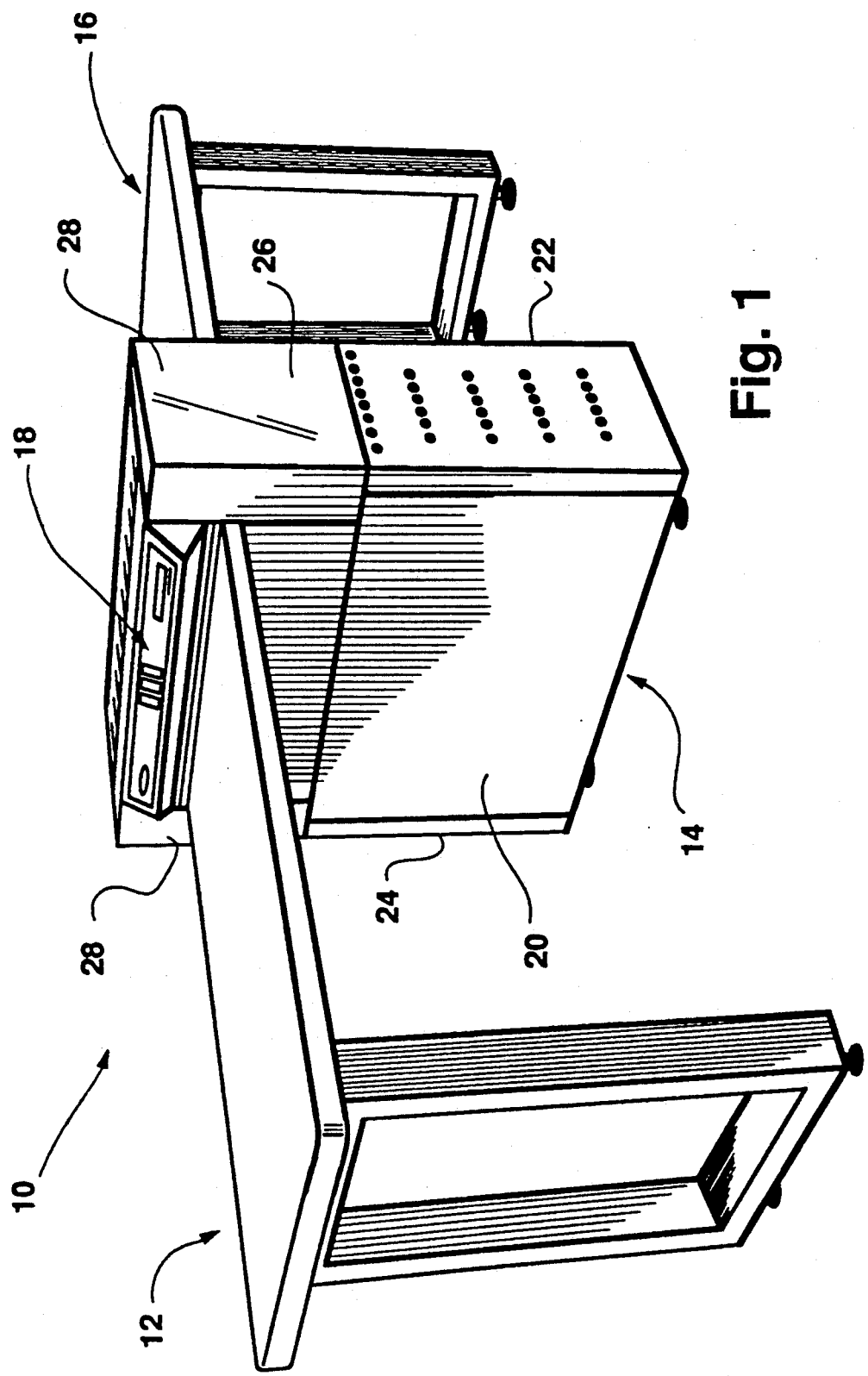
FIG. 1 is a perspective view of an off-press apparatus for laminating an image sheet to an image receiving substrate in accordance with the present invention.

Throughout the following detailed description, similar reference characters refer to similar elements in all figures of the drawings.

Referring to FIG. 1, there is illustrated a perspective view of an off-press, pre-press or pre-plate apparatus 10 for laminating an image sheet to an image receiving substrate in accordance with the present invention. The laminating apparatus 10 generally comprises a sheet preparation and feed table 12, a laminator 14 and a sheet output receiving table 16. An operator control pad 18 is conveniently located on the laminator 14. The laminator 14 comprises a front side 20, a rear side 22, a left side 24 and a right side 26. The sheet preparation and feed table 12 extends from the front side 20 of the laminator 14. The sheet output receiving table 16 extends from the rear side 22 of the laminator 14.

Figure 2:
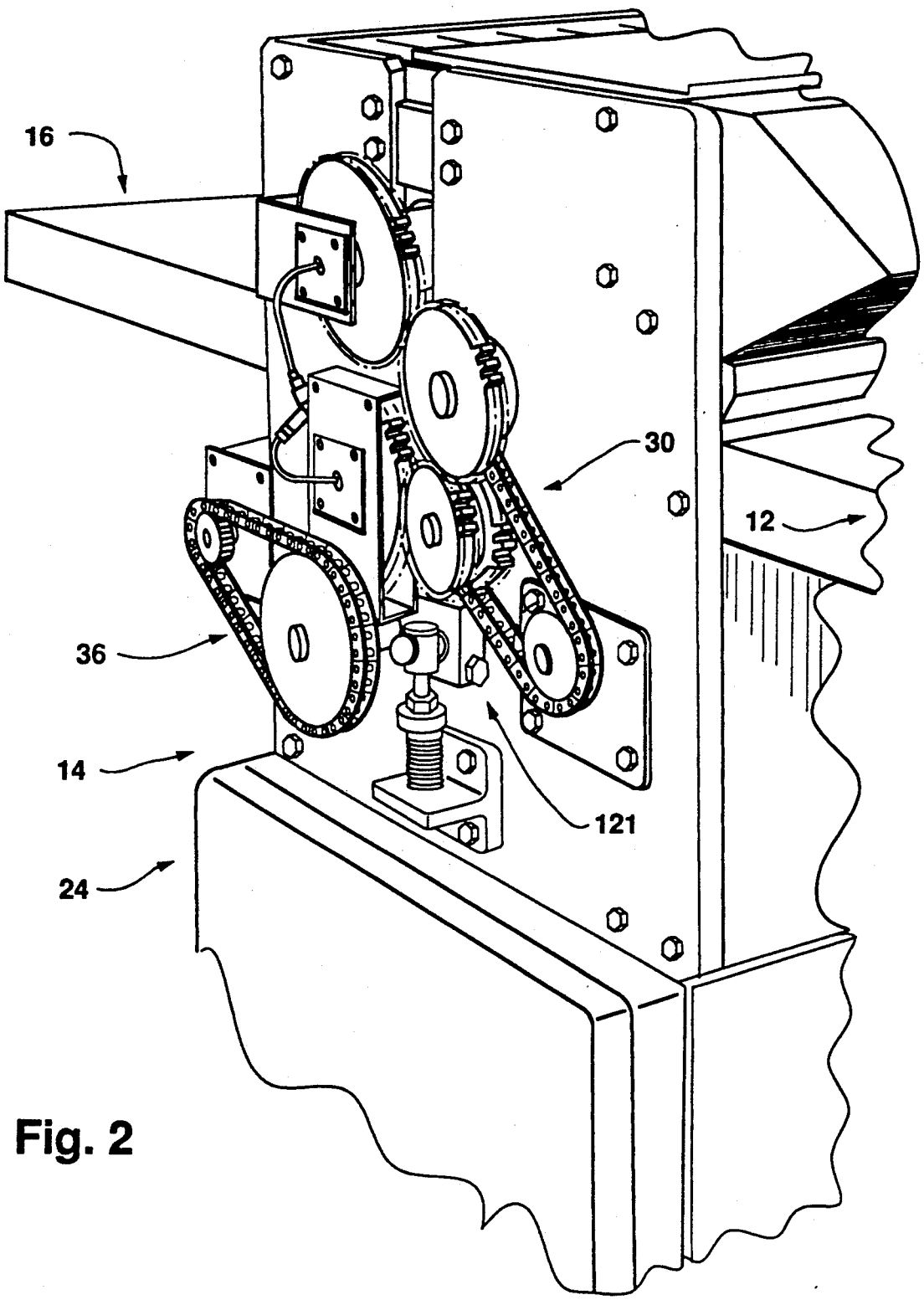
FIG. 2 is a perspective view of a left or first side of the apparatus of FIG. 1 with housing portions removed showing (1) a drive mechanism for rotating a first roller assembly and a second roller assembly and (2) an adjustment assembly for changing a nip distance between the first roller assembly and the second roller assembly.
Figure 3:
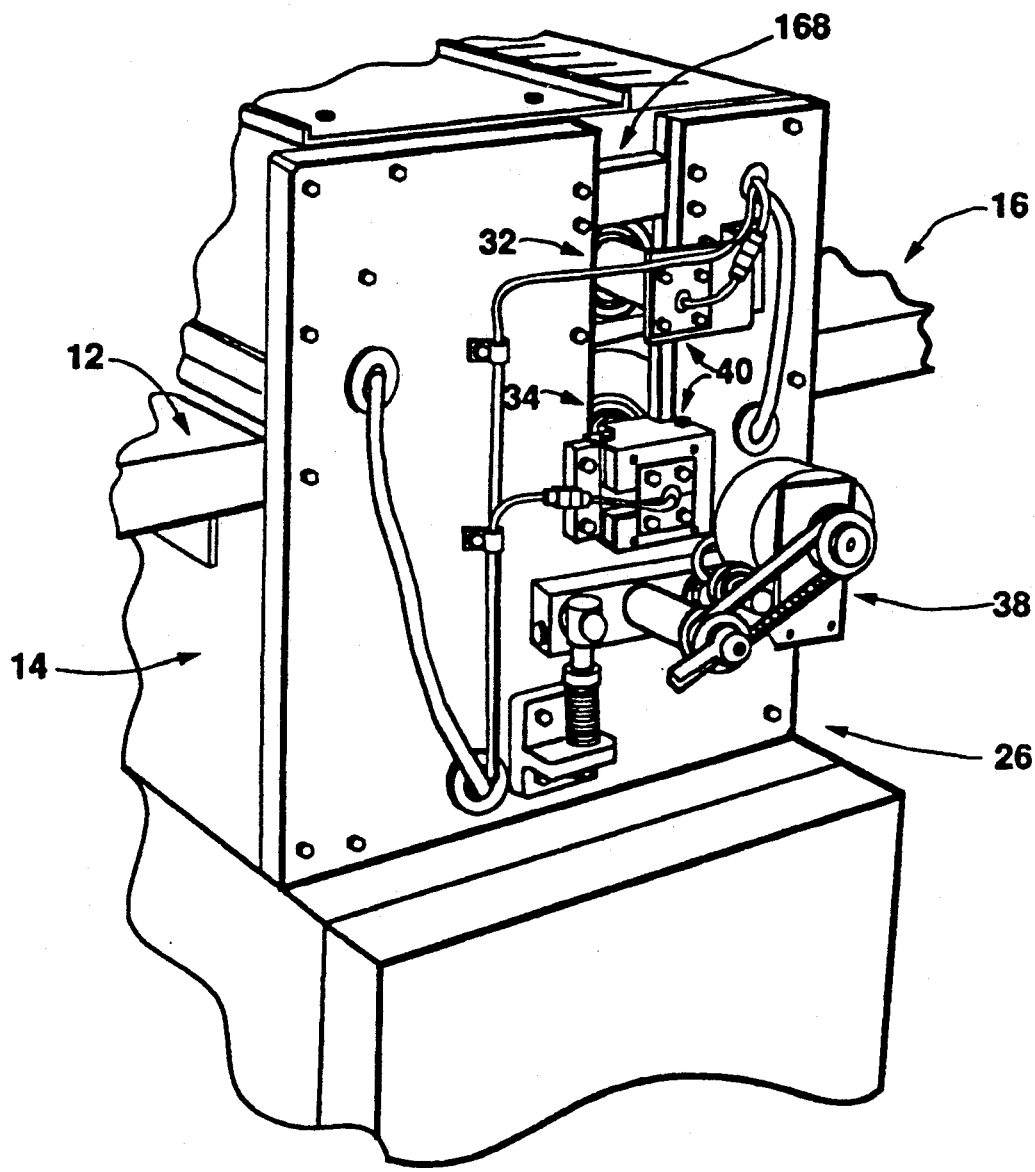
FIG. 3 is a perspective view of a right or second side of the apparatus of FIG. 1 with housing portions removed showing (1) a nip position control assembly and (2) brackets supporting heaters in the first and second roller assemblies.
Figure 4:
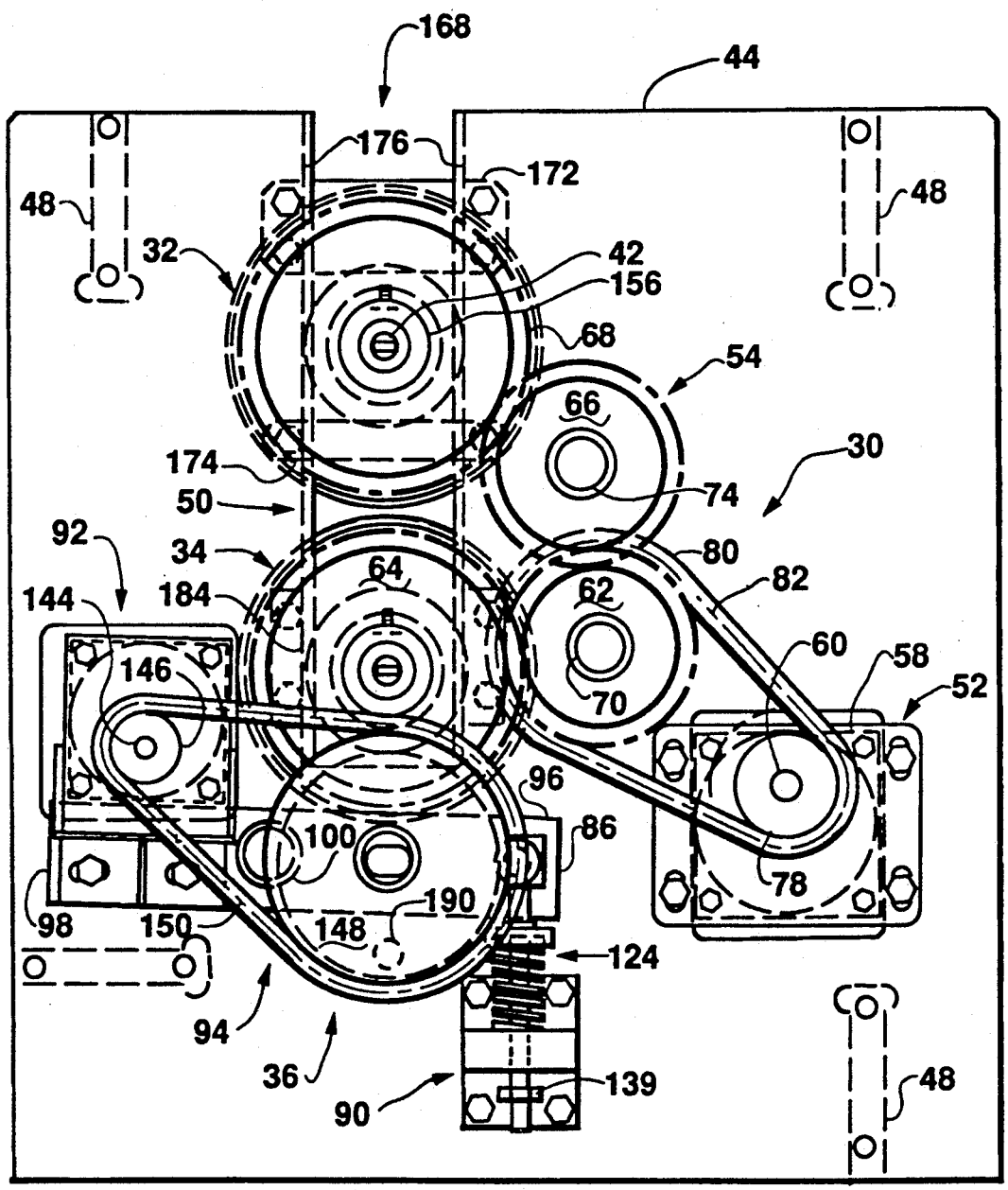
FIG. 4 is a view of the left or first side of the apparatus of FIG. 1 with housing portions removed showing a first extreme nip distance between the first roller assembly and the second roller assembly.
Figure 5:
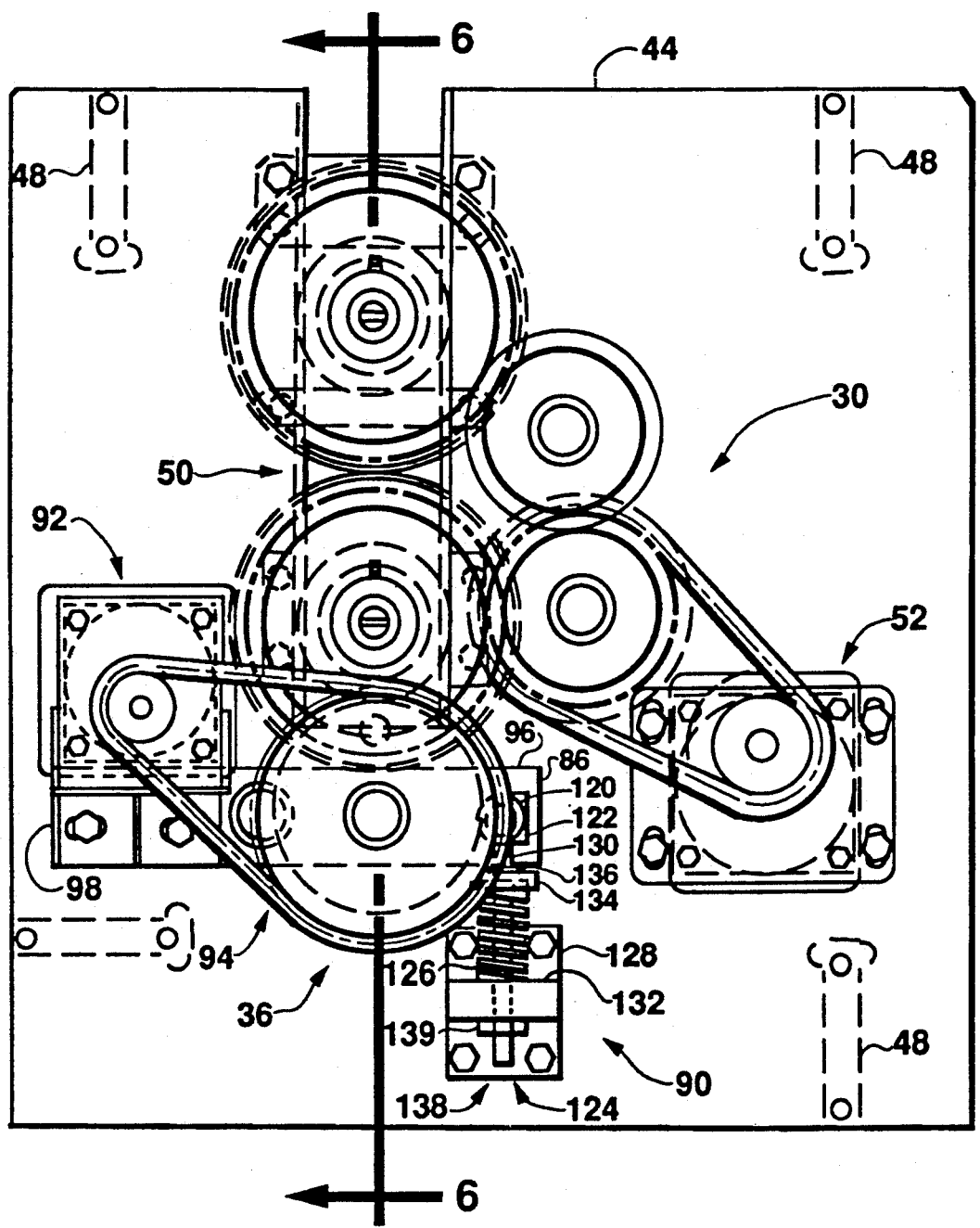
FIG. 5 is a view of the left or first side of the apparatus of FIG. 1 with housing portions removed showing a second extreme nip distance between the first roller assembly and the second roller assembly.
Figure 6:
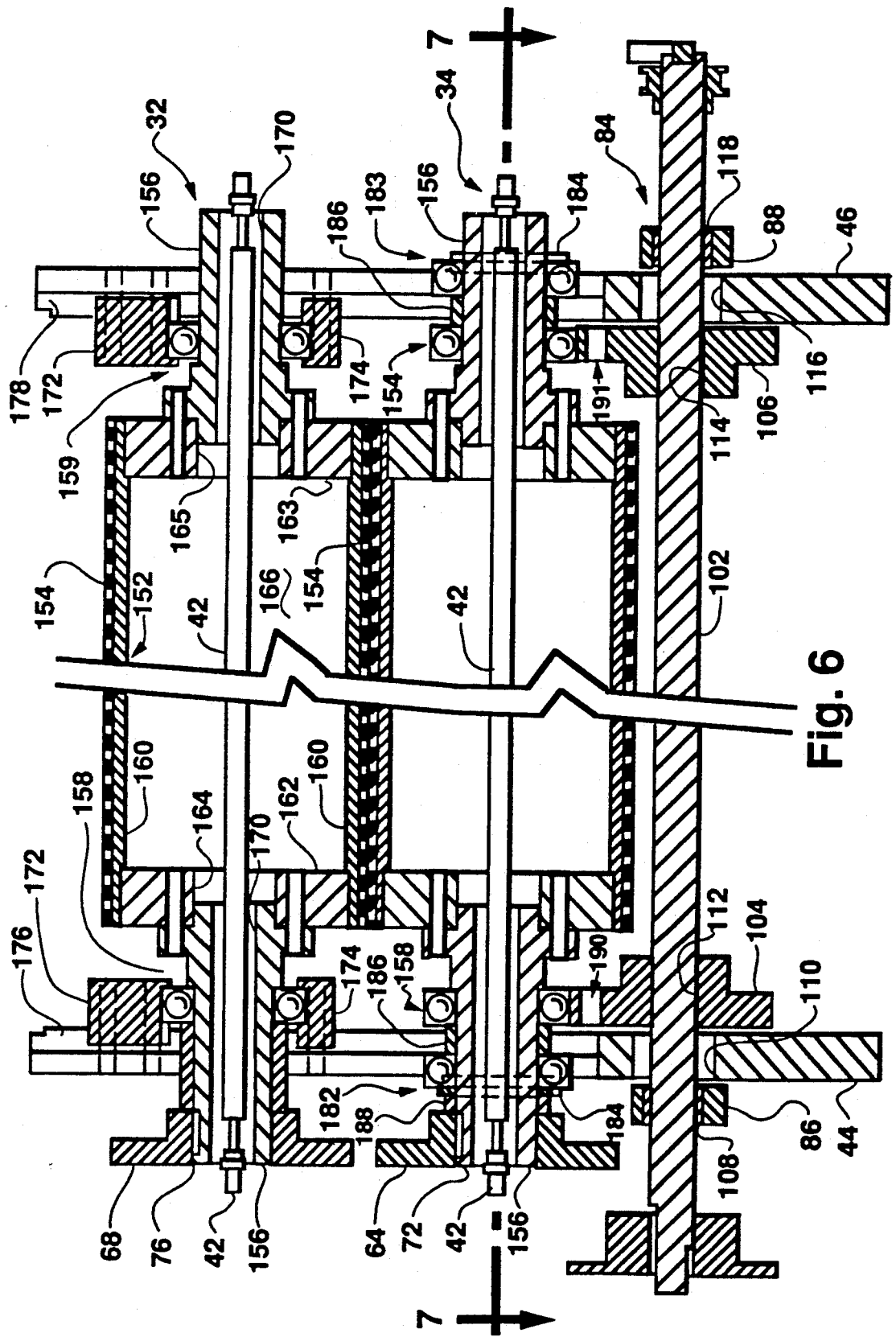
FIG. 6 is a cross sectional view of the first roller assembly, the second roller assembly and a cam assembly taken generally along the line 6—6 in FIG. 5 in the direction of the arrows.
Figure 7:
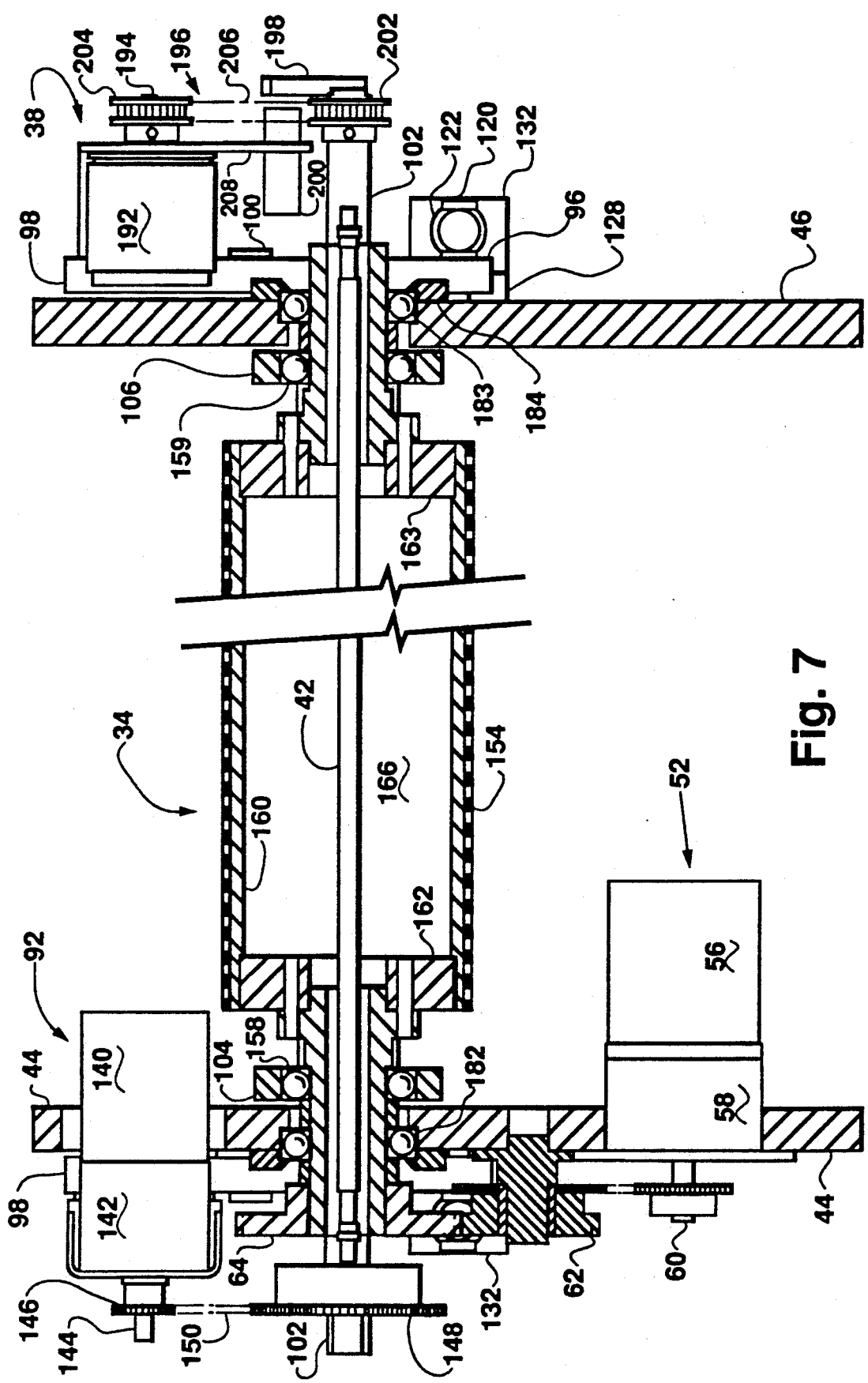
FIG. 7 is a cross sectional view of one of the roller assemblies taken generally along the line 7—7 in FIG. 6 in the direction of the arrows.

FIG. 2 is a perspective view of the left or first side 24 of the laminator 14 with housing portions 28 removed showing (1) a transport drive mechanism 30 for rotating a first or upper roller assembly 32 and a second or lower roller assembly 34 and (2) a nip adjustment assembly 36 for changing a nip distance between the first roller assembly 32 and the second roller assembly 34. The nip adjustment assembly 36 is also used to change the nip pressure or linear force being applied by the lower roller assembly 34 on the upper roller assembly 32 when the roller assemblies 32, 34 are in contact with one another. FIG. 3 is a perspective view of the right or second side 26 of the laminator 14 of FIG. 1 with housing portions 28 removed showing (1) a nip position control assembly 38 and (2) brackets 40 supporting heaters or heater elements 42 in the first and second roller assemblies 32,34. FIG. 4 is a view of the left or first side 24 of the laminator 14 with housing portions 28 removed showing the first extreme nip distance between the first roller assembly 32 and the second roller assembly 34 where the roller assemblies 32,34 are spaced apart as far as they can be. FIG. 5 is a view of the left or first side 24 of the apparatus 10 with housing portions 28 removed showing the second extreme nip distance between the first roller assembly 32 and the second roller assembly 34 where the roller assemblies 32,34 are spaced as close to each other as possible which provides the greatest pressure or linear force at a nip 50. FIG. 6 is a cross sectional view of the first roller assembly 32, the second roller assembly 34 and a cam assembly 84 taken generally along the line 6—6 in FIG. 5 in the direction of the arrows. FIG. 7 is a cross sectional view of the second or lower roller assembly 34 taken generally along the line 7—7 in FIG. 6 in the direction of the arrows.

Referring to FIGS. 2-7, the laminator 14 comprises a support having a left side frame 44 and a right side frame 46. The side frames 44,46 can be connected together, such as, by support bars assemblies 48 (see FIGS. 4 and 5). The laminator 14 further comprises the first lamination roller assembly 32 and the second lamination roller assembly 34. The first lamination roller assembly 32 is rotatably mounted between the left frame 44 and the right frame 46. The second lamination roller assembly 34 is also rotatably mounted between the left frame 44 and the right frame 46 parallel or substantially parallel to the first roller assembly 32 forming the nip 50 between the roller assemblies 32,34.

The transport drive mechanism 30 comprises means for driving the first roller assembly 32 and the second roller assembly 34 such that the magnitude of the tangential velocity of a point on the circumference of the first roller assembly 32 is the same as the magnitude of the tangential velocity of a point on the circumference of the second roller assembly 34. The transport drive mechanism 30 comprises a transport drive motor assembly 52 and a gear train arrangement 54. The transport drive motor assembly 52 is mounted to one of the frames, such as the left frame 44. The gear train arrangement 54 interconnects the motor assembly 52, the first roller assembly 32 and the second roller assembly 34.

The transport drive motor assembly 52 may comprise a motor 56, a gear box 58 connected to the motor 56 and a first shaft 60 rotatably driven by the motor 56.

The gear train arrangement 54 comprises a first gear 62, a second gear 64, a third gear 66 and a fourth gear 68. The first gear 62 is rotatably mounted on a shaft 70 supported by the left frame 44 and adapted to be rotated by the motor assembly 52. The second gear 64 is fixed to an end portion 72 of the second roller assembly 34 and positioned to be rotated by the first gear 62. The third gear 66 is rotatably mounted on a shaft 74 supported by the left frame 44 and positioned to be rotated by the first gear 62. The fourth gear 68 is fixed to an end portion 76 of the first roller assembly 32 and positioned to be rotated by the third gear 66.

The first gear 62 can be mounted on the first shaft 60 of the motor assembly 52. Alternatively, as shown in the figures, the motor assembly 52 may further include a first sprocket 78, a second sprocket 80 and a chain 82. The first sprocket 78 can be mounted on the first shaft 60. The second sprocket 80 can be mounted on the same shaft 70 that the first gear 62 is mounted on. The chain 82 would then interconnect the first sprocket 78 and the second sprocket 80. Thus, when the motor assembly 52 is activated, it rotates the first shaft 60, which in turn rotates the first sprocket 78, the chain 82, the second sprocket 80 and the first gear 62, the second gear 64 and the third gear 66, and the fourth gear 68. This simultaneously drives the first roller assembly 32 and the second roller assembly 34. As a result, when an image sheet is placed or stacked on an image receiving substrate in an original position on the feed table 12 and the stacked sheet and substrate are fed between the first roller assembly 32 and the second roller assembly 34, the driven roller assemblies 32,34 will transport the stacked sheet and substrate between the roller assemblies 32,34 with the stacked sheet and substrate moving at or substantially at the same transport rate. The words "relative shear" are defined as the distance that the sheet moves with respect to the substrate per unit of time.

The nip adjustment assembly 36 comprises means for adjusting the distance of the nip 50 between the first and second roller assemblies 32,34 where the distance of the nip 50 can be adjusted to a plurality of distinct nip distances including a first extreme (illustrated in FIG. 4) and a second extreme (illustrated in FIG. 5) spaced from the first extreme. The nip adjustment assembly 36 further comprises means for adjusting the pressure or linear force applied at the nip 50 by the roller assemblies 32,34 such that the apparatus 10 can be adjusted to laminate image sheets to image receiving substrates at a plurality of operating pressures or linear forces.

Referring to FIGS. 2-7, the nip adjustment assembly 36 preferably comprises a first or left side lever 86, a second or left side lever 88, the cam assembly 84, a biasing mechanism 90, a cam or nip drive motor assembly 92, and a drive arrangement 94.

The first side lever 86 has a first end portion 96 and a second end portion 98. The first lever 86 is pivotally connected to a first pivot shaft 100 supported on the left frame 44 between the lever first end portion 96 and the lever second end portion 98.

The second side lever 88 similarly has a first end portion and a second end portion. The second lever 88 is pivotally connected to a second pivot shaft supported on the right frame 46 between its first end portion and its second end portion. See FIG. 3.

Referring to FIG. 6, the cam assembly 84 is rotatably connected to the first lever 86 and the second lever 88. The cam assembly 84 preferably comprises a cam shaft 102, a first cylindrical cam 104 and a second cylindrical cam 106. The cam shaft 102 extends through a bushing 108 in the first lever 86, a passage 110 in the left frame 44, an off-axis passage 112 in the first cylindrical cam 104, an off-axis passage 114 in the second cylindrical cam 106, a passage 116 in the right frame 46 and a bushing 118 in the second lever 88. The bushings 108,118 allow the cam shaft 102 to rotate with respect to the levers 86,88.

The biasing mechanism 90 comprises means for biasing the first end portions 96 of the levers 86,88 such that a force is applied by the biasing means through the levers 86,88, the cam assembly 84 onto the second or lower roller assembly 34 towards the first or upper roller assembly 32. Referring to FIG. 5, the biasing mechanism or means 90 preferably comprises a shaft 120, a cylinder head 122, a pin assembly 124, a compression spring 126 and a mounting block 128. The shaft 120 can be secured in a hole in the left lever 86 by a screw or bolt 121. See FIG. 2. The cylinder head 122 has a passage through it to receive the shaft 120. The cylinder head 122 can be fabricated in one piece with the pin assembly 124. A lower end of the pin 130 extends through a passage through a flange 132 on the mounting block 128. The pin assembly 124 further comprises a spring cap 134 on the pin 130 with a lock nut 136 limiting the motion of the spring cap 134 towards the cylinder head 122. The position of the lock nut 136 on the pin 130 is threadedly adjustable. The spring 126 is positioned around the pin 130 between the spring cap 134 and the mounting block flange 132. The mounting block 128 is attached, such as, by nut and bolt assemblies 138 to the left frame 44. The pin assembly 124 further comprises a manually adjustable nut 139, such as a locking nut, threadedly attached to a lower end of the pin 130. The nut 139 prestresses the spring 126. Thus, when the roller assemblies 32,34 come into contact with one another or with an object between the roller assemblies 32,34, the force applied by the roller assemblies 32,34 per additional rotation of the cams 104,106 towards the second extreme position illustrated in FIG. 5 is initially greater than would be the case if the springs 126 were not prestressed. A similar biasing mechanism or means 90 is connected between the right lever 88 and the right frame 46. The function of the biasing mechanism 90 is to apply a manually adjustable compliant force upwardly supporting the first end portions 96 of the levers 86,88.

Referring to FIG. 7, the cam motor assembly 92 is mounted to one of the second end portions 98 of the levers 86,88, such as the second end portion 98 of the first lever 86. The cam motor assembly 92 may comprise a cam or nip drive motor 140, a gear box 142 and a shaft 144 rotatable by the motor 140 and gear box 142.

The cam drive arrangement 94 interconnects the cam motor assembly 92 and the cam assembly 84. The cam drive arrangement 94 preferably comprises a first cam sprocket 146, a second cam sprocket 148 and a roller chain or belt 150. The first cam sprocket 146 is mounted on the cam motor assembly shaft 144. The second cam sprocket 148 is mounted on a first end portion of the cam shaft 102. The roller chain 150 interconnects the first cam sprocket 146 and the second cam sprocket 148. Thus, when the cam motor assembly 92 is activated, it rotates, in turn, the cam motor assembly shaft 144, the first cam sprocket 146, the roller chain 150, the second cam sprocket 148, the cam shaft 102 and the cylindrical cams 104,106.

Referring to FIG. 6, the first roller assembly 32 preferably comprises a hollow rigid cylindrical tubular body 152, a flexible polymeric layer 154, a pair of hubs 156, a first pair of bearings 158,159 and a heater element 42. The body 152 preferably comprises a cylindrical wall 160 having an outer circumferential surface and an inner circumferential surface, both substantially symmetric about a longitudinal axis. The body 152 further comprises end walls 162,163 having passages 164,165 extending through them at the longitudinal axis allowing access to an inner chamber 166 generally defined by the cylindrical wall 160 and the end walls 162,163. Preferably, the body 152 comprises steel or aluminum. The flexible polymeric layer 154 covers the outer circumferential surface. Preferably, the flexible polymeric layer 154 comprises a silicone elastomer and has a thickness no greater than about 0.100 inches (0.254 centimeters). Preferably, the first roller assembly 32 (specifically, the body 152 and the layer 154) has/have a diameter greater than about 3.5 inches (8.89 centimeters). One of the hubs 156 is mounted on each end wall 162,163, such as, by nut and bolt assemblies (not depicted). Parts can be secured together by any suitable means, such as by welding them together. A left one of the hubs 156 extends through a vertical slot 168 (see FIG. 4) in the left frame 144 and a right one of the hubs 156 extends through a vertical slot 168 (see FIG. 3) in the right frame 46. Passages 170 extend through the hubs 156 along the longitudinal axis. The heater element 42 extends through the passages 170 in the hubs 156, the passages 164,165 through the end walls 162,163 and the inner chamber 166 of the body 152. The heater element 42 is supported by the bracket assemblies 40 mounted between each end of the heater element 42 and the adjacent side frame 44,46. See FIGS. 2 and 3. One 158 of the bearings 158,159 is positioned around the left hub 156. One 159 of the bearings 158,159 is positioned around the right hub 156. The left bearing 158 and the right bearing 159 are secured between top bearing blocks 172 and bottom bearing blocks 174. The left top bearing block 172 and the left bottom bearing block 174 are connected, such as by nut and bolt assemblies (depicted in FIGS. 2, 4 and 5), in a groove 176 in an inside surface of the left frame 44. The right top bearing block 172 and the right bottom bearing block 174 are connected, such as by nut and bolt assemblies (depicted in FIG. 3), in a groove 178 in an inside surface of the right frame 46. The bearing blocks 172,174 and grooves 176,178 prevent movement of the first roller assembly 32 in any direction radial to the longitudinal axis. The fourth gear 68 is mounted to the left end of the left hub 156. A spacer 180 can be provided on the left hub 156 between the left bearing 158 and the fourth gear 68.

The second roller assembly 34 is preferably identical to the first roller assembly 32 except as follows. The first pair of bearings 158,159 rest or lay on cylindrical outer surfaces of the cams 104,106, rather than being mounted between top and bottom bearing blocks 172,174. Further, the second roller assembly 34 includes a second pair of bearings 182,183. A left one 182 of the second pair of bearings is positioned in the left slot 168 between the left hub 156 and the left frame 44. A right one 183 of the second pair of bearings is positioned in the right slot 168 between the right hub 156 and the right frame 46. A roller bearing retainer 184 is mounted on each of the side frames 44,46 confining the bearings 182,183 to within the slots 168 thereby permitting the bearings 182,183 to move vertically in the slots 168, but preventing the bearings 182,183 from moving horizontally. The second gear 64 is mounted to the left end of the left hub 156. Spacers 186 can be positioned on the hubs 156 between the first bearings 158,159 and the second bearings 182,183. A spacer 188 can be provided on the left hub 156 between the second left bearing 182 and the second gear 64.

Thus, when the cam motor assembly 92 is activated, it rotates, in turn, the cam motor assembly shaft 144, the first cam sprocket 146, the roller chain 150, the second cam sprocket 148, the cam shaft 102 and the cylindrical cams 104,106. Since the cylindrical cams 104,106 are mounted off-axis on the cam shaft 102, this changes the distance between the cam shaft 102 and the first bearings 158,159 on the hubs 156 of the second or lower roller assembly 34. This causes the outer cylindrical surface of the cams 104,106 to raise or lower the first bearings 158,159 and, therefore, the second roller assembly 34 with respect to the first roller assembly 32. Intermediate the two extreme positions of the cams 104,106 illustrated in FIGS. 4 and 5, the roller assemblies 32,34 first come into contact with one another. This can be described as the "first contact position" of the cams 104,106 and the roller assemblies 32,34. In the first contact position, there is virtually no force being applied on the upper roller assembly 32 by the lower roller assembly 34. When the cams 104,106 continue to rotate from the first contact position towards the position illustrated in FIG. 5, the lower roller assembly 34 does not significantly move with respect to the upper roller assembly 32. However, turning of the cams 104,106 beyond the first contact position towards the position illustrated in FIG. 5 causes the first ends 96 of the levers 86 to pivot about the pivot shafts 100 compressing the springs 126 increasing the force applied by the lower roller assembly 34 on the upper roller assembly 32.

A hole or mark 190,191 has been provided on the cams 104,106 to indicate the greatest radial distance on the cam. Thus, when the hole 190,191 is positioned as in FIG. 4, the nip distance 50 between the first roller assembly 32 and the second roller assembly 34 is at the first extreme where the roller assemblies 32,34 are spaced apart as far as they can be. When the hole 190,191 is positioned as in FIG. 5, the nip distance 50 between the roller assemblies 32,34 is at the second extreme where the roller assemblies 32,34 are spaced as close to each other as possible. In the second extreme position where the second roller assembly 34 is closest to the first roller assembly 32, the first gear 62 and the second gear 64 are engaged to transmit torque from the first gear 62 to the second gear 64. Furthermore, in the first extreme position where the second roller assembly 34 is farthest from the first roller assembly 32, the first gear 62 and the second gear 64 are spaced farther apart than in the first position, but are still engaged to transmit torque from the first gear 62 to the second gear 64.

Referring to FIGS. 3 and 7, the nip position and pressure or linear force control assembly 38, otherwise referred to the cam motor assembly controlling means, preferably comprises an encoder assembly 192 having a rotatable shaft 194, means 196 for rotating the encoder assembly shaft 194 in response to rotation of the cam assembly 84, a position lever or striker 198, and a proximity sensor or switch 200. The encoder assembly 192 is mounted to the second end portion 98 of the right side lever 86. The rotating means 196 can comprise a first pulley 202, a second pulley 204 and a belt 206. The first pulley 202 is attached to a right end portion of the cam shaft 102. The second pulley 204 is attached to the encoder shaft 194. The belt 206 interconnects the pulleys 202,204. The striker or position lever 198 extends radially from the end of the cam shaft 102 near the first pulley 202. The proximity sensor or switch 200 can be mounted on a bracket 208 connected to the right lever 86 to sense the presence or absence of the striker or position lever 198.

Figure 9:
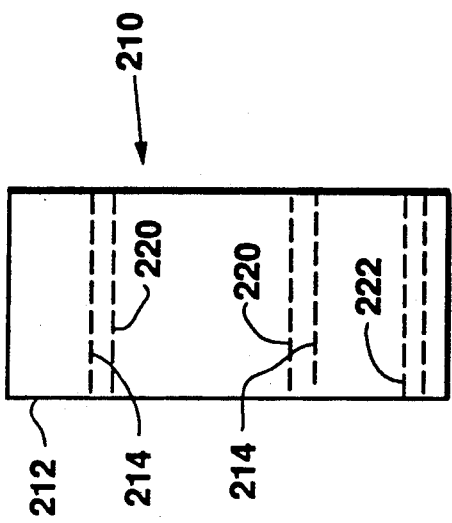
FIG. 9 is an enlarged side view of the bearing assembly of FIG. 8.
Figure 8:
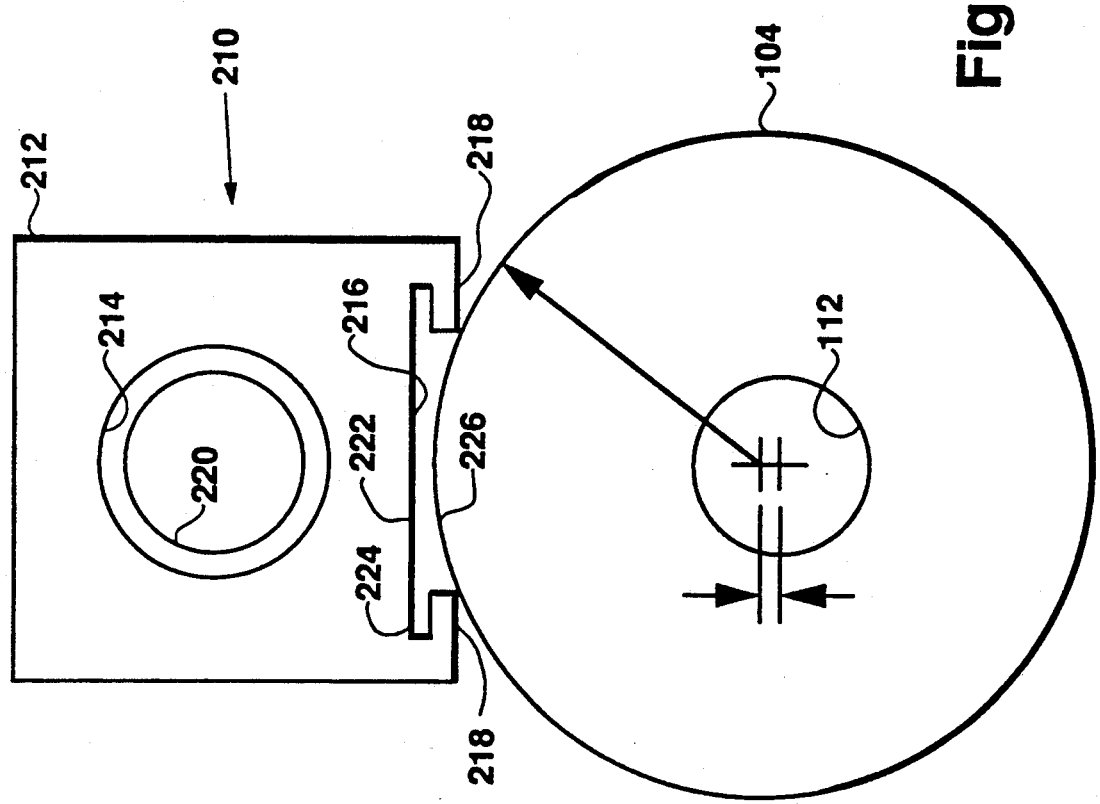
FIG. 8 is an enlarged front view of an alternative embodiment of a bearing assembly adjacent a cam for use in the apparatus of the present invention.

FIG. 8 is an enlarged front view of an alternative embodiment of a bearing assembly 210 adjacent the cam 104 for use in the apparatus 10 of the present invention. FIG. 9 is an enlarged side view of the bearing assembly 210 of FIG. 8. The alternative bearing assembly 210 can be used instead of the bearing assemblies 158,159 illustrated in FIGS. 6 and 7. The alternative bearing assembly 210 can comprise a block 212 having a bore 214 and a slot 216. The bore 214 extends generally through the block 212. The slot 216 is defined by lips or flanges 218 extending from one side of the block 212. The block 212 is illustrated generally rectangular, but it can be square or any other shape. A sleeve 220 lines or covers the bore 214. The bearing assembly 210 includes an insert 222 with end portions 224 and a cylindrical bearing surface 226. The end portions 224 are secured within the lips 218 in the slot 216. The bearing surface 226 is for contacting the cam surface. The sleeve 220 and the insert 222 are made of a durable material, such as Vespel TM. The sleeve 220 is for receiving one of the hubs 156.

FIG. 10A is a schematic illustration of an electrical control system for the present invention. The electrical control system comprises means for automatically controlling the driving means 30 and the adjusting means 36 in response to operator input through the control panel 18. The electrical control system includes a programmable logic controller (PLC) 230 connected to a power distribution network 232 or the like through a step down transformer 234 which converts voltage, such as, from 220 Volts to 115 Volts at 50 Watts. A suitable PLC 230 that can be used in the present invention is commercially available under model number D100CR14 from Cutler Hammer with offices in Philadelphia, Pa. The suitable power distribution network 232 may include fuse blocks, terminal blocks and interconnections between components of the control system. For instance, the power distribution network 232 may be connectable by an input cable 236 to a power supply, such as a 220 Volt 16 Amp AC power supply (not depicted). Alternatively, the control system could be designed to receive power from a 120 Volt AC power supply in which case step down transformers would not be needed in the control system.

A DC power supply 238 is connected between the input cable 236 and the control pad 18, an encoder switch 240, the proximity switch 200, and a transport motor "reverse select" switch 242 which is illustrated on the control pad 18. The DC power supply 238 continuously provides DC power to all soft-on/soft-off power circuits in the control system. The control pad 18 may include a "ready" lamp 244, an "error" lamp 246, a "paper position" lamp 248, a "film position" lamp 249, a "power" lamp 250, a "power on" switch 252, a "power off" switch 253, a "mode selector" switch 254, and the transport motor "reverse select" switch 242. A power switching device 256 is connected by a line 255 between the control or key pad 18 and the power distribution network 232. A suitable power switching device 256 that can be used in the present invention is commercially available under model number CE15DN2B from Cutler Hammer. The power switching device 256 is a soft-on/soft-off circuit having several relays and a large contactor to handle the power. An output from the PLC 230 is connected to a coil portion 260 of a "delay off" relay 260,261. The contact portion 261 of the "delay off" relay 260,261 is incorporated in the power distribution network 256. The soft-on/soft-off circuit provides DC power to items connected to the DC power supply 238 at all times. A line 258 also interconnects the power switching device 256 with an input to the PLC 230.

The key pad 18 is connected by lines 262,264 to provide and receive signals from the PLC 230. The encoder sensor 240 and the proximity switch 200 are connected by lines 266,268 to provide signals to the PLC 230. The encoder assembly 192 and encoder switch 240 are chosen such that the encoder switch 240 provides a plurality of predetermined pulses each revolution of 360 degrees by the encoder shaft 194. For instance, if the encoder switch 240 provides 1,000 pulses per revolution, then after 500 pulses from the encoder switch 240, the PLC 230 knows that the cams 104,106 have rotated 180 degrees.

The transport motor 56 and the cam motor 140 are AC reversible motors and are connected in parallel to a step down transformer 270 connected to the power distribution network 232. The step down transformer 270 converts the voltage from 220 volts to 115 volts providing 600 watts of power.

An output line connects the PLC 230 to a coil portion 272 of a "nip drive" relay 272,273. The contact portion 273 of the "nip drive" relay 272,273 is in an input line to the cam motor 140.

An output line connects the PLC 230 to a coil portion 274 of a "nip drive reverse" relay 274,275. The contact portion 275 of the "nip drive reverse" relay 274,275 is in the input line to the cam motor 140.

An output line connects the PLC 230 to a coil portion 276 of a "speed select" relay 276,277. A motor controller 278 is in an input line to the transport motor 56. A first variable potentiometer 280 and a second variable potentiometer 282 are connected through a contact portion 277 of the "speed select" relay 276,277 as inputs to the motor controller 278.

The "reverse select" switch 242 on the key pad 18 energizes or deenergizes a "reverse select" relay 284,285. FIG. 10B is a schematic illustration of a "reverse select" switch 242 in series with a coil portion 284 of a "reverse select" relay 284,285. When the switch 242 is closed, power from the DC power supply 238 directly energizes a coil portion 284 of the "reverse select" relay 284,285. The contact portion 285 of the "reverse select" relay 284,285 is in the input line to the transport motor 56.

The electrical control system includes an electrical temperature control subsystem 290. The electrical temperature control subsystem 290 comprises a first temperature controller 292 connected in parallel between a first line 294 and second line 296, the first and second lines 294,296 being connected to the power distribution network 232. A first solid state relay 298 is connected between the first temperature controller 292 and the first heater element 42 (in the top roller assembly 32) which, in turn, is connected to the first line 294. Similarly, a second temperature controller 302 is connected in parallel between the first line 294 and the second line 296. A second solid state relay 300 is connected between the second temperature controller 302 and the second heater element 42 (in the bottom roller assembly 34) which, in turn, is connected to the first line 294. The first and second solid state relays 298,300 are also connected to the second line 296. A first temperature contact sensor 302 is positioned to sense the temperature of the top roller assembly 32 and is connected to provide signals representative of the sensed temperature to the first temperature controller 292. Similarly, a second temperature contact sensor 304 is positioned to sense the temperature of the bottom roller assembly 34 and is connected to provide signals representative of the sensed temperature to the second temperature controller 302. Suitable temperature controllers 292,302 that can be used in the present invention are commercially available under model number PYZ4TDY1-IV from Fuji Electric of Japan.

The first temperature controller 292 includes a first alarm circuit 306. The second temperature controller 302 includes a second alarm circuit 308. The first alarm circuit 306 and the second alarm circuit 308 are connected in series between the DC power supply 238 and the PLC 230.

In operation, the apparatus 10 is activated by pressing the "power on/off" toggle switch 252 which sends a signal to the device 256 over line 255. Then the device 256 applies power to the entire control system. This causes the PLC 230 to turn on the "power" lamp 250, reset all its functions and initiate moving the apparatus 10 to the position of the cams 104,106 and the nip position 50 illustrated in FIG. 5 which is called the home position. Specifically, the PLC 230 activates the cam motor 140 by sending a signal to the coil portion 272 of the "nip drive" relay 272,273 which closes the contact portion 273 of the "nip drive" relay 272,273 and causes the cam motor 140 to run in a forward direction. This causes the cams 104,106 to rotate closing or opening the nip 50. When the position lever or striker 198 enters into the flux of the proximity sensor or switch 200, the PLC 230 knows that the nip distance 50 is at the second extreme and that the cams 104,106 are as illustrated in FIG. 5. When the PLC 230 receives this signal from the proximity switch 200, the PLC 230 (1) resets internal counters to zero and (2) stops the cam motor 140 by deactivating the coil portion 272 of the "nip drive" relay 272,273 opening its contact portion 273. Then the PLC 230 energizes the coil portion 272 of the "nip drive" relay 272,273 closing its contact portion 273 again. However, at the same time, the PLC 230 activates the coil portion 274 of the "nip drive reverse" relay 274,275 which closes its contact portion 275 which in effect reverses the power lines to the cam motor 140 and reverses its direction. While the cams 104,106 are moving from their home position, the PLC 230 is counting the pulses received from the encoder switch 240 and comparing the sum to a first preset number stored in memory in the PLC 230 between and including zero and 500, typically the preset number corresponds to a 25 degree to 45 degree turn of the cams 104,106 from their home position. The first preset number is chosen to provide the desired pressure on the precolored photosensitive elements to be laminated to a substrate by the apparatus 10. When the counted sum and the first preset number are equal, the PLC 230 deactivates the relays 272,273, and 274,275 opening their contact portions 273,275 stopping the cam motor 140 at that position. At this position of the cams 104,106, the roller assemblies 32,34 are still in contact with one another and the lower roller assembly 34 is applying a first operating pressure or linear force on the upper roller assembly. At the same time, the PLC 230 turns on the "film position" lamp 249.

The linear force can be decreased to a second operating pressure or linear force where the roller assemblies 32,34 are still in contact with one another by pressing the "mode selector" switch 254. Pressing the "mode selector" switch 254 sends a signal to the PLC 230 over line 262 which causes the PLC 230 to reactivate the "nip drive" relay 272,273 (but not the "nip drive reverse" relay 274,275) closing its contact portion 273 reenergizing the cam motor 140 in the forward direction. When the position lever or striker 198 enters into the flux of the proximity sensor or switch 200, the PLC 230 knows that the cams 104,106 and the nip distance 50 are at the extreme position illustrated in FIG. 5. When the PLC 230 receives this signal from the proximity switch 200, the PLC 230 (1) resets internal counters to zero and (2) stops the cam motor 140 by deactivating the coil portion 272 of the "nip drive" relay 272,273 opening its contact portion 273. Then the PLC 230 energizes the coil portion 272 of the "nip drive" relay 272,273 closing its contact portion 273 again. However, at the same time, the PLC 230 activates the coil portion 274 of the "nip drive reverse" relay 274,275 which closes its contact portion 275 reversing the power lines to the cam motor 140 and reversing its direction. While the cams 104,106 are moving from their home position, the PLC 230 is counting the pulses received from the encoder switch 240 and comparing the sum to a second preset number stored in memory in the PLC 230 between and including zero and 500, typically the preset number corresponds to a 45 degree to 90 degree turn of the cams 104,106 from their home position. The second preset number is chosen to provide the desired pressure on the precolored photosensitive elements and substrate to be laminated to a final transfer sheet by the apparatus 10. When the counted sum and the second preset number are equal, the PLC 230 deactivates the relays 272,273 and 274,275, opening their contact portions 273,275 stopping the cam motor 140 at that position. At the same time, the PLC 230 turns on the "paper position" lamp 248. At this position of the cams 104,106, the roller assemblies 32,34 are still in contact with one another and the lower roller assembly 34 is applying a second operating pressure or linear force on the upper roller assembly. The second linear operating force is less than the first linear operating force.

Activating the apparatus 10 by pressing the "power on" switch 252 further causes the power switching network 256 to provide power throughout the electrical control circuit. This immediately energizes the transport motor 56 causing the roller assemblies 32,34 to rotate.

When the PLC 230 changes the operating pressure or linear force between the roller assemblies 32,34, it also changes the speed of the transport motor 56. When the apparatus 10 is initially activated by pressing the "power on" switch 252, the "speed selection" relay 276,277 is not energized. In this case, the contact portion 277 of the "speed selection" relay 276,277 connects the first potentiometer 280 to the transport motor controller 278. The first potentiometer 280 is preset to cause the transport motor controller 278 to control the transport motor 56 to run at a first operating speed. When the "mode selector" switch 254 is pressed to switch the operating pressure or linear force to the second operating pressure or linear force, the PLC 230 also energizes the coil portion 276 of the "speed selection" relay 276,277 which moves its contact portion 277 from the first position disconnecting the first potentiometer 280 to a second position connecting the second potentiometer 282. The second potentiometer 282 is preset to cause the transport motor controller 278 to control the transport motor 56 to run at a second operating speed which is slower than the first operating speed.

Pressing the "reverse select" switch 242 directly energizes the coil portion 284 of the "reverse select" relay 284,286. This closes its contact portion 286 of the "reverse select" relay 284,286 reversing the power lines to the transport motor 56 reversing its direction. Closing the contact portion 286 can optionally activate a time delay relay (not depicted) for preventing the immediate reversal of the transport motor 56. When the time delay relay times out, the reversal of the transport motor motor 56 would then be accomplished. Use of the "reverse select" switch 242 facilitates removal of jammed materials in the roller assemblies 32,34.

The temperature controllers 292,302 also switch on in response to pressing the "power on" switch 252. The temperature controllers 292,302 control the temperature of the heater elements 42 based on manually inputted preset values and feedback from the temperature sensors 302,304. The temperature controllers 292,302 also act as step down transformers converting to an output like a 24 Volt DC power signal. The temperature controllers 292,302 cannot directly drive the heater elements 42 because the heater elements 42 require higher voltage levels. So the solid state relays 298,300 are used to receive the low voltage output from the controllers 292,302 and provide a higher voltage to the heater elements 42.

A high temperature preset and a low temperature preset can be inputted to each one of the alarm circuits 306,308. The alarm circuits 306,308 monitor the temperature being fed back from the temperature contact sensors 302,304. When the temperature of the upper roller assembly 32 is between the inputted high and low temperature presets for the first alarm circuit 306, the first alarm circuit 306 is activated and closes a switch creating an electrical path through the first alarm circuit 306. When the temperature of the lower roller assembly 34 is between the inputted high and low temperature presets for the second alarm circuit 308, the second alarm circuit 308 is activated and closes a switch creating an electrical path through the second alarm circuit 308. When both of the alarm circuits 306,308 are activated, a signal is sent from the alarm circuits 306,308 to the PLC 230. Then the PLC 230 sends a signal to turn on the "ready" lamp 244 on the control pad 18. A timer in the PLC 230 is preset a specified time, like 45 minutes, which is longer than the usual warm up time. From the point in time that the "power on" switch 252 is activated, the PLC 230 measures time and if the PLC 230 does not receive a signal from the alarm circuits 306,308 within that specified time period, then the PLC 230 sends a signal to activate the "error" lamp 246 indicating there is a temperature problem and prevents activation of the "ready" lamp 244. Further, assuming both roller assemblies 32,34 come into the preset operating temperature range which cause the alarm circuits 306,308 to send a signal to the PLC 230 within the specified time period, then if that signal is broken the PLC 230 sends a signal to the "error" lamp 246 indicating there is a temperature problem.

When the apparatus 10 is being deactivated, i.e., when the "power off" switch 253 is pressed, this causes the power switching network 256 to switch off some power, but not all. The part that is cut off is the part that enables the apparatus 10 to be reactivated prior to the apparatus 10 completing its shut down steps. The PLC 230 receives signals from the power switching network 256 over line 258 indicating that part of the network 256 has been turned off. This causes the PLC 230 to activate the "nip drive" relay 272,273 energizing the cam motor 140. The "nip drive reverse" relay 274,275 remains off. When the PLC 230 receives a signal from the proximity switch 200 indicating that the cams 104,106 are in their home position, the PLC 230 starts counting pulses from the encoder switch 240. The PLC 230 compares the total number of pulses from the encoder switch 240 to a preset number corresponding to 180 degrees rotation of the cams 104,106, i.e., 500 pulses. Then the PLC 230 deactivates the "nip drive" relay 272,273 deenergizing the cam motor 140 with the roller assemblies 32,34 in the position illustrated in FIG. 4. Then the PLC 230 turns off the "power" lamp 250 and deenergizes the "delay off" relay 260,261 completing the power down sequence. At one point or another during the shut down sequence, all of the lamps on the control pad 18 are turned off.

The off-press apparatus 10 of the present invention can be used to perform an off-press method for laminating at least one color image sheet to an image receiving substrate and then transferring the color image(s) from the receiving substrate to a transfer sheet to form a proof.

Specifically, referring to FIG. 11A, a first precolored photosensitive element 410 comprising a first aqueously developable precolored photosensitive layer 412 on a first removeable support 414 is exposed to actinic radiation through a first color separation transparency forming first image areas 416 and first non-image areas 418 in the first aqueously developable precolored layer 412. The first precolored photosensitive element 410 may include a first adhesive layer 411 between the first photosensitive layer 412 and the first removeable support 414.

Next, the exposed first element 410' is processed to develop a first color image by washing away the first non-image areas 418 with water. See FIG. 11A.

Then, the first image bearing element 410' is laminated to an intermediate receiving substrate 400 by transporting the first image bearing element 410' on the substrate 400 through the roller assemblies 32,34 (heated by the heaters 42) which are parallel or substantially parallel and which apply a first operating pressure or linear force OLF1 on the first image bearing element 410' and the substrate 400. This first laminating step is illustrated in FIG. 11A. The substrate 400 may include a support layer 402 and an adhesive layer 404. FIG. 11A is a schematic illustration of laminating by applying pressure and heat through a nip 50 set to apply a first operating pressure or linear force OLF1 by the first roller assembly 32 and the second roller assembly 34 to sandwich the image sheet 410' having one colored image 416 together with the receiving substrate 400 having no colored images.

The first removeable support 414 is then peeled and/or removed from the first image bearing element 410'. The first adhesive layer 411 can remain or substantially remain on the first image bearing element 419. See FIG. 11B.

Then, referring to FIG. 11B, a transfer or display sheet 450, such as a sheet of paper, can be laminated to the first image bearing element 419 through the pair of heated rollers 32,34 set to apply a second operating pressure or linear force OLF2 on the first image bearing element 419 and the transfer sheet 450. This can form a single color right reading proof. Alternatively, the substrate 402 can be peeled from the first image bearing element forming a single color right reading proof 490.

Alternatively, rather than laminating a transfer sheet 450 to the first image bearing element 419, a second image bearing element 420' can be laminated to the first image bearing element 419. See FIG. 12A.

Figure 12A:
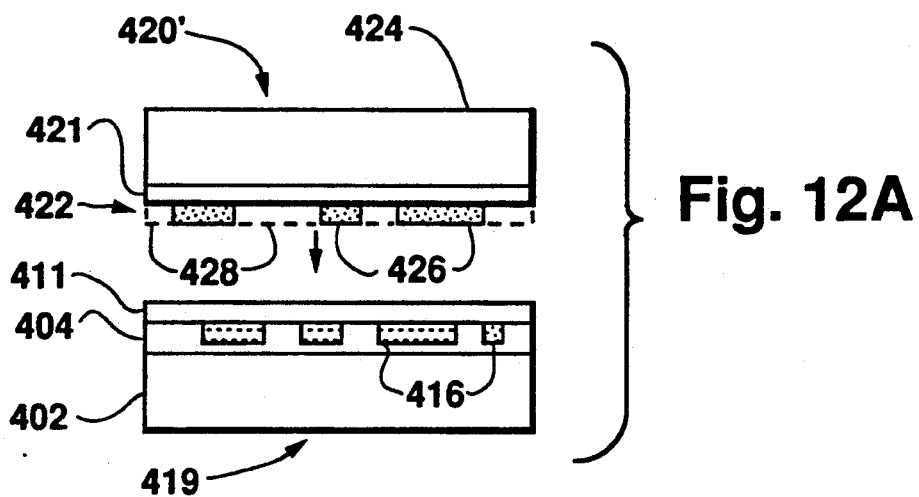
FIGS. 12A–C are schematic illustrations of intermediate laminating steps in a process of forming a multicolor proof.

The second image bearing element 420' can be made by repeating the exposing step, the processing step, the laminating step and the peeling step with (1) a second precolored photosensitive element 420 comprising a second aqueously developable precolored photosensitive layer 422 on a second removeable support 424 instead of the first element, (2) a second color separation transparency instead of the first transparency, and (3) in the laminating step, laminating the second image bearing element 420' substantially in register on the first image bearing element 419, rather than on the substrate 400. This second laminating step is illustrated in FIG. 12A.

Figure 12B:
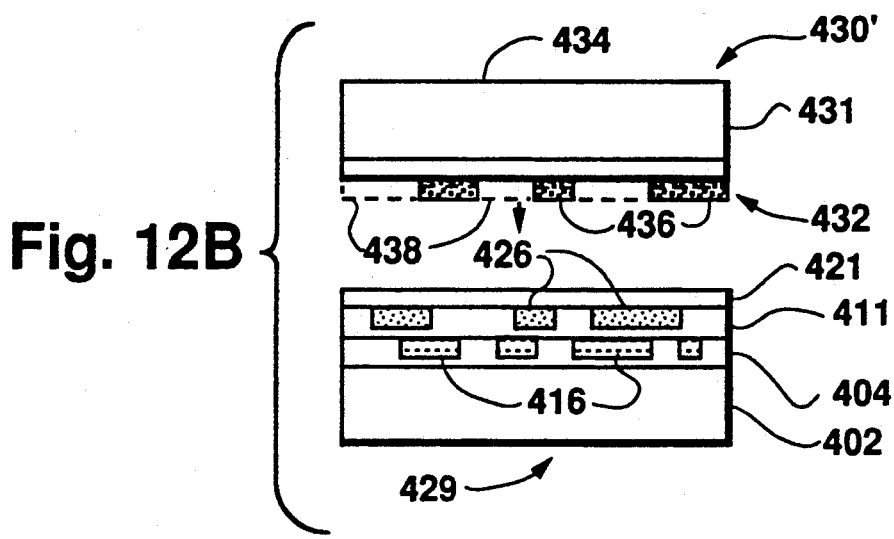

Then the first exposing step, the first processing step, the first laminating step and the first peeling step can be repeated with (1) a third precolored photosensitive element 430 comprising a third aqueously developable precolored photosensitive layer 432 on a third removeable support 434 instead of the first element, (2) a third color separation transparency instead of the first transparency, and (3) in the laminating step, laminating the third image bearing element 430' on the second image bearing element 429 substantially in register with the first image bearing element 419. This third laminating step is illustrated in FIG. 12B.

Figure 12C:
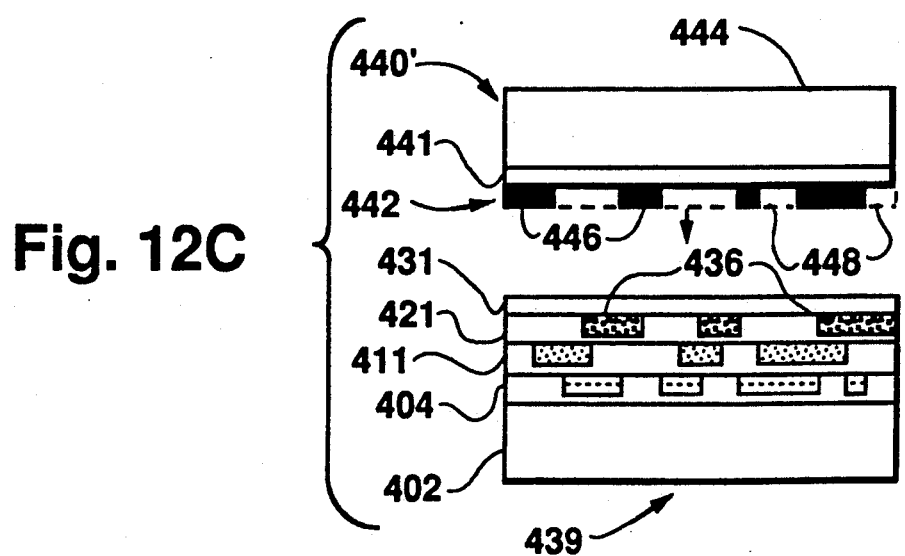

Then the first exposing step, the first processing step, the first laminating step and the first peeling step can be repeated with (1) a fourth precolored photosensitive element 440 comprising a fourth aqueously developable precolored photosensitive layer 442 on a fourth removeable support 444 instead of the first element, (2) a fourth color separation transparency instead of the first transparency, and (3) in the laminating step, laminating the fourth image bearing element 440' on the third image bearing element 439 substantially in register with the first image bearing element 419. This fourth laminating step is illustrated in FIG. 12C.

In the second laminating step (illustrated in FIG. 12A), the third laminating step (illustrated in FIG. 12B), and/or the fourth laminating step (illustrated in FIG. 12C), the cams 104,106 can be positioned to cause the roller assemblies 32,34 to apply a third operating pressure or linear force which is less than the first operating pressure or linear force and greater than the second operating pressure or linear force. Alternatively. The operating pressure or linear force can change, e.g., decrease, with each additional element being laminated to the prior laminate.

Suitable illustrative photosensitive elements 410,420,430,440 that can be used in the present invention are disclosed in U.K. Patent publication GB 2144867 B. For instance, the photosensitive elements 410,420,430,440 can include from one side to the other a base layer, a thin release layer or coating, a thin heat sealable adhesive layer or coating and a photosensitive layer. When a release layer is included, preferably it is peeled off with the base layer as part of the removeable supports 414,424,434,444 in the peeling steps. In other words, in reference to FIGS. 11, 12 and 13, each one of the support layers 414,424,434,444 may comprise a plurality of layers including, for instance, a base layer and a thin release layer or coating. Suitable illustrative intermediate receiving substrates 400 that can be used in the present invention are disclosed in U.S. Pat. Nos. 4,482,625 and 4,766,053. For instance, the intermediate receiving substrates 400 can include from one side to the other a protective removable cover sheet, a thin heat curable adhesive layer or coating, a thin release layer or coating, a thin first anchor layer or coating, a polyester base layer, a thin second anchor layer or coating, and a thin antistatic layer or coating. When the receiving substrate 400 includes a release layer, preferably it is peeled off with its base layer in the last peeling step after the last laminating step. Thus, in reference to FIGS. 11, 12 and 13, the support layer 402 may comprise a plurality of layers including, for instance, a thin release layer or coating, a thin first anchor layer or coating, a polyester base layer, a thin second anchor layer or coating, and a thin antistatic layer or coating.

The order of some of the steps is unimportant. For instance, all of the photosensitive elements that are going to be laminated together can be exposed and then developed in any order prior to laminating them onto the receiving substrate or prior laminate. For instance, all of the photosensitive elements that are going to be laminated together can be exposed and developed prior to any of the laminating steps. Alternatively, after one photosensitive element is exposed and developed, it can be laminated to the receiving substrate or prior laminate before any other photosensitive element is exposed and developed.

Figure 13:
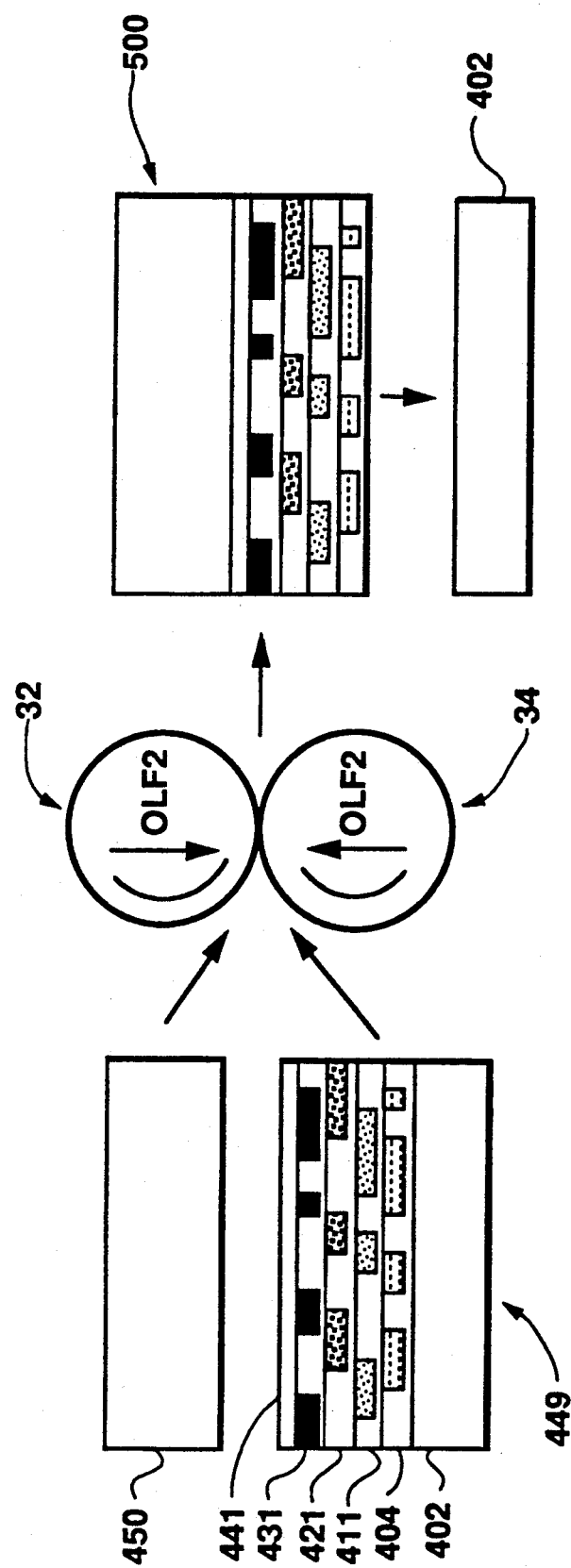
FIG. 13 is a schematic illustration of laminating by applying pressure and heat through a nip set at a second operating pressure or linear force between a first roller assembly and a second roller assembly to sandwich the receiving substrate having four colored images together with a transfer sheet.

Finally, as illustrated in FIG. 13, a transfer or display sheet 450, such as a sheet of paper, is laminated to the fourth image bearing element 449 through the pair of heated roller assemblies 32,34 set to apply a second operating pressure or linear force OLF2 on the multicolor bearing element 449 and the transfer sheet 450 sandwiching the first, second, third and fourth image bearing elements. This forms a four color right reading proof. Further, the support 402 of the substrate 400 can be peeled away and/or removed from the first image bearing element forming a four color right reading proof 500. The adhesive layer 404 originally forming part of the intermediate receiving substrate 404 can be transferred to the transfer sheet 450 along with the multicolor image. FIG. 13 is a schematic illustration of laminating by applying pressure and heat through a nip set at a second operating pressure or linear force OLF2 between the first roller assembly 32 and the second roller assembly 34 to sandwich the receiving substrate 449 having four colored images together with a transfer sheet 450.

Proper lamination occurs in specific and possibly different pressure (or linear force) ranges, temperature ranges and transport speed ranges depending on the materials being laminated together. However, preferably, the linear force applied by the lower roller assembly 34 on the upper roller assembly 32 is at or about 3.83 pounds per linear inch for each of the lamination steps except the last laminating step. Preferably, the linear force applied by the lower roller assembly 34 on the upper roller assembly 32 is at or about 15 pounds per linear inch for the last lamination step. Even more preferred is (1) using a linear force between the roller assemblies 32,34 at or about 5 pounds per linear inch for the first lamination step illustrated in FIG. 11 and (2) using a linear force between the roller assemblies 32,34 at or about 3.83 pounds per linear inch for the second, third and fourth lamination steps illustrated in FIGS. 12 A-C and (3) using a linear force between the roller assemblies 32,34 at or about 15 pounds per linear inch for the fifth lamination step illustrated in FIGS. 13. Preferably, the temperature of the outer surfaces of the roller assemblies is at or about 110 degrees Celsius. Preferably, the transport speed is at or about 500 millimeters per minute for each of the lamination steps except the last laminating step. Preferably, the transport speed is at or about 300 millimeters per minute for the last lamination step. Under these preferred conditions, when an a four color proof is made in accordance with the above described method of the present invention, the second, third and fourth images will be in register within 100 microns with respect to the first image.

Before the last laminating step (illustrated in either FIG. 11A or 13) where the transfer sheet 450 is laminated to the multicolor image bearing substrate 419 or 449, the first exposing step, the first processing step, the first laminating step and the first peeling step can be repeated one or more times with (1) an nth precolored photosensitive element comprising a nth aqueously developable precolored photosensitive layer on an nth removeable support instead of the first element, (2) an nth color separation transparency instead of the first transparency, and (3) in the laminating step, laminating the nth image bearing element on the nth minus one image bearing element and substantially in register with the first image bearing element. Then in the last laminating step, the transfer sheet 450 is laminated to the nth image bearing element.

To further illustrate the present invention, the following example is provided.

EXAMPLE

A first photosensitive element having a first precolored (i.e., yellow) photosensitive layer on one side of the element was placed on a rubber-like bladder of a vacuum frame entitled a "Fast Draw Vacuum System" commercially available from Teaneck Graphics of Carlstadt, N.J. A premanufactured first color, i.e., yellow, separation transparency containing a halftone image, specifically a System Brunner Test Form, was placed on the first element with the emulsion side of the first color separation transparency in contact with the precolored photosensitive layer of the first element. The glass top of the vacuum frame was swung closed onto the first color separation transparency. The vacuum frame was activated evacuating air from between the bladder and the glass top bringing the first element and the first separation into intimate contact. An ultraviolet (UV) light source was positioned above the vacuum frame. A curtain was drawn to enclose the vacuum frame so that light from the source would be substantially contained within the drawn curtain. The UV light source was activated to shine UV light towards the glass top and the first color separation transparency. The UV light source was a photopolymer lamp L1261 controlled by a light integrator entitled "An Olite Light Source" AL53/100, both commercially available from Olec Corporation of Irvine, Calif. The UV light passed through clear or transparent regions of the first color separation onto (and exposing) areas of the photosensitive layer in the first element which became hardened image areas and non-soluable in water. Non-transparent regions of the first separation blocked UV light from exposing other areas of the photosensitive layer in the first element which remained soluble in water. The vacuum frame was deactivated. The first separation and the first element were removed from the vacuum frame.

The first element was processed (developed) in the Waterproof ™ Processor described in copending U.S. Pat. application No. IM-0489 and commercially available from E. I. du Pont de Nemours and Company of Wilmington, Del. The photosensitive layer side of the element was allowed to contact the rotating and oscillating brush in the Processor. The Processor was set to transport the first element at 30 inches per minute through the Processor. Water sprayed from the primary spray bar at 70° Celsius (C) and 25 pounds per inch (psi). The rotating and oscillating brush scrubbed at 1100 inches per minute. The dryer temperature was 110° C. Non-hardened non-image areas were washed away being soluble in the wash water of the Processor.

The above procedure was repeated three more times in order to expose and then develop a second precolored (i.e., magenta) photosensitive layer on a second photosensitive element, a third precolored (i.e., cyan) photosensitive layer on a third photosensitive element, and a fourth precolored (i.e., black) photosensitive layer on a fourth photosensitive element.

Each one of the 4 photosensitive elements were 25 inches by 38 inches by about 6 mils. Each one of the elements comprised 4 layers which from the side contacting the bladder included a 4 mil polyester base layer, a thin release layer or coating, a thin heat sealable adhesive layer or coating and a photosensitive layer. The photosensitive layer on the first element contained a yellow pigment dispersed therein which made the element appear yellowish. The photosensitive layer on the second element contained a magenta pigment dispersed therein which made the element appear magentaish. The photosensitive layer on the third element contained a cyan pigment dispersed therein which made the element appear cyanish. The photosensitive layer on the fourth element contained a black pigment dispersed therein which made the element appear blackish.

A carrier plate was placed on the sheet preparation table of a Waterproof ™ Laminator described in this application and commercially available from E. I. du Pont de Nemours and Company of Wilmington, Del. The carrier plate was aluminum with a white top surface. A flap of film was attached to a leading edge of the white side of the carrier plate to trap the leading edge of the films being laminated together so they do not wrap onto the rolls of the Laminator. A cover sheet was peeled off a receiving substrate. The receiving substrate was placed on top of the white side of the carrier plate. The receiving substrate from the surface contacting the carrier plate to its other or top side comprised a thin heat curable adhesive layer or coating, a thin release layer or coating, a thin first anchor layer or coating, a 4 mil polyester base layer, a thin second anchor layer or coating, and a thin antistatic layer or coating. The receiving substrate was 25 inches by 38 inches by about 6 mils.

The power on switch on the Laminator was activated which automatically set the pressure or linear force at the nip to be 300 pounds across 28 inches, the temperature of the surface of the rolls to be 110° C. and the transport speed to be 500 millimeters per minute.

The first element was placed on the receiving substrate with the hardened image areas contacting the adhesive layer of the receiving substrate. The flap was placed over the leading edge of both the first element and the receiving substrate. The first element was wiped with a brush to remove trapped air from between the first element and the receiving substrate. When the ready light of the Laminator was on, the leading edges of the carrier strip, the receiving substrate and the first element were slid into the nip so that the roller assemblies transported them between the roller assemblies laminating the elements together. The laminate was allowed to cool to room temperature to ensure that the adhesive wouldn't separate. The polyester base layer and the release layer were then peeled off the remainder of the first image bearing element.

The second element was placed on the remainder of the first element with the hardened image areas of the second element contacting the adhesive layer of the first element. The flap was placed over the leading edge of the remainder of the first element, the second element and the receiving substrate. The second element was wiped with a brush to remove trapped air from between the second element and the remainder of the first element. A 20X magnifying glass was used to look at registration marks on the first and second images to determine which direction the second element needed to be rubbed to move the second element with respect to the remainder of the first element in order to align or register the second image areas on top of the first image areas. The leading edges of the carrier strip, the receiving substrate and the first and second elements were slid into the nip so that the roller assemblies transported them between the roller assemblies laminating the elements together. The laminate was allowed to cool to room temperature to ensure that the adhesive wouldn't separate. The polyester base layer and the release layer were then peeled off the remainder of the second image bearing element.

The third element was placed on the remainder of the second element with the hardened image areas of the third element contacting the adhesive layer of the second element. The flap was placed over the leading edge of the remainder of the first element, the second element, the third element and the receiving substrate. The third element was wiped with a brush to remove trapped air from between the third element and the remainder of the second element. A 20X magnifying glass was used to look at registration marks on the first, second and third images to determine which direction the third element needed to be rubbed to move the third element with respect to the remainder of the second element in order to align or register the third image areas on top of the first and second image areas. The leading edges of the carrier strip, the receiving substrate and the first, second and third elements were slid into the nip so that the roller assemblies transported them between the roller assemblies laminating the elements together. The laminate was allowed to cool to room temperature to ensure that the adhesive wouldn't separate. The polyester base layer and the release layer were then peeled off the remainder of the third image bearing element.

The fourth element was placed on the remainder of the third element with the hardened image areas of the fourth element contacting the adhesive layer of the third element. The flap was placed over the leading edge of the remainder of the first element, the second element, the third element, the fourth element and the receiving substrate. The fourth element was wiped with a brush to remove trapped air from between the fourth element and the remainder of the third element. A 20X magnifying glass was used to look at registration marks on the first, second third and fourth images to determine which direction the fourth element needed to be rubbed to move the fourth element with respect to the remainder of the third element in order to align or register the fourth image areas on top of the first, second and third image areas. The leading edges of the carrier strip, the receiving substrate and the first, second, third and fourth elements were slid into the nip so that the roller assemblies transported them between the roller assemblies laminating the elements together. The laminate was allowed to cool to room temperature to ensure that the adhesive wouldn't separate. The polyester base layer and the release layer were then peeled off the remainder of the fourth image bearing element.

A sheet of Warrenflo paper which is a number 3 press paper was placed on the heat sealable adhesive layer of the fourth element. The flap was placed over the leading edge of the paper, the remainder of the first element, the second element the third element, the fourth element and the receiving substrate. The paper was wiped with a brush to remove trapped air from between the paper and the remainder of the fourth element. The "mode select" switch was pressed on the Laminator changing the nip pressure or linear force to 450 pounds across the 28 inches and the transport rate and temperature remained the same. The leading edges of the carrier strip, the receiving substrate, the first, second, third and fourth elements and the paper were slid into the nip so that the roller assemblies transported them between the roller assemblies laminating them together. The laminate was allowed to cool to room temperature to ensure that the adhesive wouldn't separate. Then the release layer, first anchor layer, the base layer, the second anchor layer and the antistatic layer of the receiving substrate were peeled off and discarded forming a four color right reading proof.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. An off-press method for laminating a color image sheet to an image receiving substrate and then transferring the color image from the receiving substrate to a transfer sheet to form a proof, comprising:

exposing a first precolored photosensitive element comprising a first aqueously developable precolored photosensitive layer on a first removeable support through a first color separation transparency forming first image areas and first non-image areas in the first aqueously developable precolored layer;

processing the exposed first element to develop a first color image by washing away the first non-image areas with water;

laminating the first image bearing element to a substrate by transporting the first image bearing element on the substrate through a pair of heated rollers which are parallel or substantially parallel and set to apply a first operating pressure or linear force on the first image bearing element and the substrate;

peeling the removeable support from the first image bearing element; and laminating a transfer sheet to the first image bearing element through the pair of heated rollers set to apply a second operating pressure or linear force on the first image bearing element and the transfer sheet.

2. The off-press method of claim 1, further comprising:

peeling the substrate from the first image bearing element forming a single color right reading proof.

3. The off-press method of claim 1, wherein the first operating pressure or linear force is less than the second operating pressure or linear force.

4. The off-press method of claim 1, wherein the first operating pressure or linear force is at or about 3.83 pounds per linear inch and the second operating pressure or linear force is at or about 15 pounds per linear inch.

5. The off-press method of claim 1, wherein all of the laminating steps are performed on a laminating apparatus comprising means for adjusting the pressure or linear force applied by the rollers.

6. The off-press method of claim 5, wherein the adjusting means comprises a cam assembly and means for rotating the cam assembly to a plurality of angles including a first position where one of the rollers is contacting and applying a first operating pressure or force on the other roller and a second position where the one roller is applying a second operating pressure or force on the other roller.

7. An off-press method for laminating color image sheets to an image receiving substrate and then transferring multicolor images from the receiving substrate to a transfer sheet to form a proof, comprising:

exposing a first precolored photosensitive element comprising a first aqueously developable precolored photosensitive layer on a first removeable support through a first color separation transparency forming first image areas and first non-image areas in the first aqueously developable precolored layer;

processing the exposed first element to develop a first color image by washing away the first non-image areas with water;

laminating the first image bearing element to a substrate by transporting the first image bearing element on the substrate through a pair of heated rollers which are parallel or substantially parallel and set to apply a first operating pressure or linear force on the first image bearing element and the substrate;

peeling the removeable support from the first image bearing element;

repeating the exposing step, the processing step, the laminating step and the peeling step with (1) a second precolored photosensitive element comprising a second aqueously developable precolored photosensitive layer on a second removeable support instead of the first element, (2) a second color separation transparency instead of the first transparency, and (3) in the laminating step, laminating the second image bearing element substantially in register on the first image bearing element, rather than on the substrate;

repeating the first exposing step, the first processing step, the first laminating step and the first peeling step with (1) a third precolored photosensitive element comprising a third aqueously developable precolored photosensitive layer on a third removeable support instead of the first element, (2) a third color separation transparency instead of the first transparency, and (3) in the laminating step, laminating the third image bearing element on the second image bearing element and substantially in register with the first image bearing element;

repeating the first exposing step, the first processing step, the first laminating step and the first peeling step with (1) a fourth precolored photosensitive element comprising a fourth aqueously developable precolored photosensitive layer on a fourth removeable support instead of the first element, (2) a fourth color separation transparency instead of the first transparency, and (3) in the laminating step, laminating the fourth image bearing element on the third image bearing element and substantially in register with the first image bearing element; and laminating a transfer sheet to the fourth image bearing element through the pair of heated rollers set to apply a second operating pressure or linear force on the substrate and the transfer sheet sandwiching the first, second, third and fourth image bearing elements.

8. The off-press method of claim 7, further comprising:

peeling the substrate from the first image bearing element forming a four color right reading proof.

9. The off-press method of claim 7, wherein the first operating pressure or linear force is less than the second operating pressure or linear force.

10. The off-press method of claim 7, wherein the first operating pressure or linear force is at or about 3.83 pounds per linear inch and the second operating pressure or linear force is at or about 15 pounds per linear inch.

11. The off-press method of claim 7, wherein:

in the second laminating step, the third laminating step, and/or the fourth laminating step, the pair of heated rollers is set to apply at least a third operating pressure or linear force.

12. The off-press method of claim 11, wherein:

in the first laminating step, the first operating linear force is at or about 5 pounds per linear inch;

in the second, third and fourth laminating steps, the third operating linear force is at or about 3.83 pounds per linear inch; and in the laminating step where the multicolor images are being laminated to the transfer sheet, the second operating linear force is at or about 15 pounds per linear inch.

13. The off-press method of claim 7, further comprising:

before the last laminating step where the transfer sheet is laminated to the multicolor image bearing substrate, repeating at least one more time the first exposing step, the first processing step, the first laminating step and the first peeling step with (1) an nth precolored photosensitive element comprising a nth aqueously developable precolored photosensitive layer on an nth removeable support instead of the first element, (2) an nth color separation transparency instead of the first transparency, and (3) in the laminating step, laminating the nth image bearing element on the nth minus one image bearing element and substantially in register with the first image bearing element; and in the last laminating step, the transfer sheet is laminated to the nth image bearing element.

14. The off-press method of claim 7, wherein all of the laminating steps are performed on a laminating apparatus comprising means for adjusting the pressure or linear force applied by the rollers.

15. The off-press method of claim 14, wherein the adjusting means comprises a cam assembly and means for rotating the cam assembly to a plurality of angles including a first position where one of the rollers is contacting and applying a first operating pressure or force on the other roller and a second position where the one roller is applying a second operating pressure or force on the other roller.

* * * * *